US009933613B2

(12) United States Patent
West

(10) Patent No.: US 9,933,613 B2
(45) Date of Patent: Apr. 3, 2018

(54) SMART MIRROR MOUNT DEVICE

(71) Applicant: Swift Control Systems, Inc., San Jose, CA (US)

(72) Inventor: Lawrence Camest West, San Jose, CA (US)

(73) Assignee: Swift Control Systems, Inc., San Jose, CA (US)

( * ) Notice: Subject to any disclaimer, the term of this patent is extended or adjusted under 35 U.S.C. 154(b) by 80 days.

(21) Appl. No.: 14/603,317

(22) Filed: Jan. 22, 2015

(65) Prior Publication Data

US 2015/0205094 A1   Jul. 23, 2015

Related U.S. Application Data

(60) Provisional application No. 61/930,042, filed on Jan. 22, 2014.

(51) Int. Cl.
  *G02B 26/08* (2006.01)
  *G02B 7/182* (2006.01)
  *G01R 27/26* (2006.01)

(52) U.S. Cl.
  CPC ....... *G02B 26/0816* (2013.01); *G02B 7/1822* (2013.01); *G01R 27/2605* (2013.01)

(58) Field of Classification Search
  CPC .... G02B 7/182; G02B 7/1821; G02B 7/1822; G02B 7/1827; G02B 7/1828; G02B 26/08; G02B 26/0816; G02B 26/0833; G02B 26/0841; G02B 26/085; G02B 26/0858; G02B 26/0866

(Continued)

(56) References Cited

U.S. PATENT DOCUMENTS 5,982,528 A * 11/1999 Melville ................ G02B 27/01
                                             359/198.1
2003/0141439 A1* 7/2003 Heminger ............... G02B 26/02
                                             250/221

(Continued)

OTHER PUBLICATIONS

Dudley et al. (Emerging Digital Micromirror Device (DMD) Applications, Proc. of SPIE vol. 4985 {2003}, pp. 14-25).*

(Continued)

*Primary Examiner* — Kimberly N Kakalec
(74) *Attorney, Agent, or Firm* — Perkins Coie LLP

(57) ABSTRACT

Techniques, systems, and devices are disclosed for manipulating light beams using one or more mirror mount assemblies communicatively coupled through a communication channel to similar devices or an external device for sensing purposes, providing user interface, or connection to the internet cloud. This mirror mount assembly provides movement of a mechanical mount and further includes an actuator, a driver electrically coupled to the actuator to drive the actuator; a control module electrically coupled to the driver to provide drive signals to the driver, a position sensor, and a control module including a processor for generating the drive signals and for autonomously implementing user defined functions on the mirror mount assembly. The mirror mount assembly also includes one or more communication interfaces coupled to the control module to receive one or more input signals from external devices. The external interface devices can include optical sensors and user interfaces.

21 Claims, 19 Drawing Sheets

(58) Field of Classification Search
USPC ......... 359/198.1–199.4, 200.6–200.8, 202.1, 359/221.2, 223.1–225.1, 226.2, 290–295, 359/838, 846, 871, 872, 904; 250/204, 250/559.06, 559.29, 230, 234; 347/255–260; 353/39, 98–990; 385/15–18, 22; 398/12, 19, 45
See application file for complete search history.

(56) References Cited

U.S. PATENT DOCUMENTS

| | | |
|---|---|---|
| 2008/0028816 A1* | 2/2008 | Slor .................... G02B 7/1821 72/319 |
| 2009/0046373 A1 | 2/2009 | Ryzhikov et al. |
| 2010/0091277 A1 | 4/2010 | Yamauchi |
| 2011/0228367 A1* | 9/2011 | Lubianiker ........ G02B 26/0841 359/199.2 |
| 2011/0292954 A1 | 12/2011 | Stoev et al. |
| 2012/0013855 A1* | 1/2012 | Lescure ............... G02B 26/101 353/81 |
| 2012/0120404 A1 | 5/2012 | Coffin |
| 2012/0281722 A1 | 11/2012 | Boggy |

OTHER PUBLICATIONS

Kim, Tae Hoon, Authorized Officer, Korean Intellectual Property Office, International Search Report, International Application No. PCT/US2015/012544, dated Apr. 30, 2015.

* cited by examiner

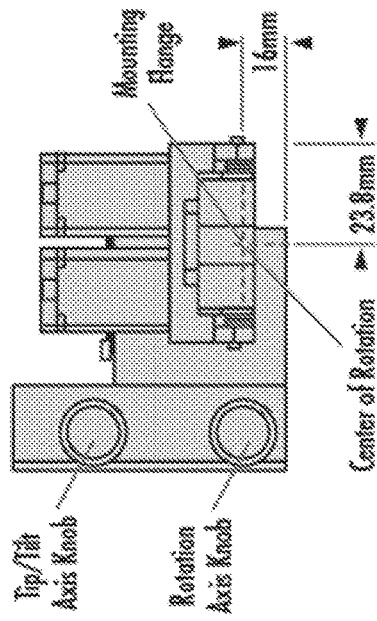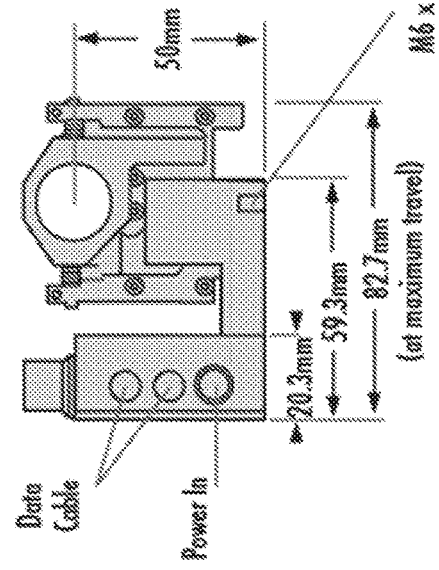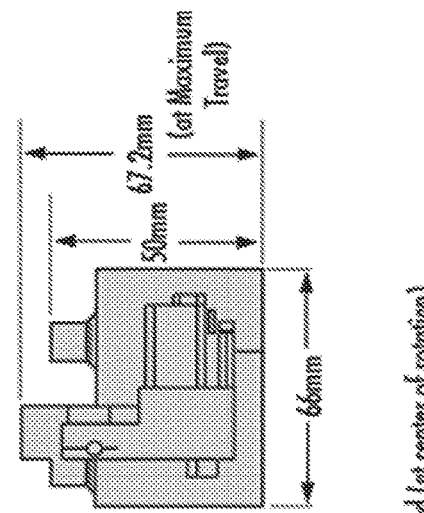
FIG. 3

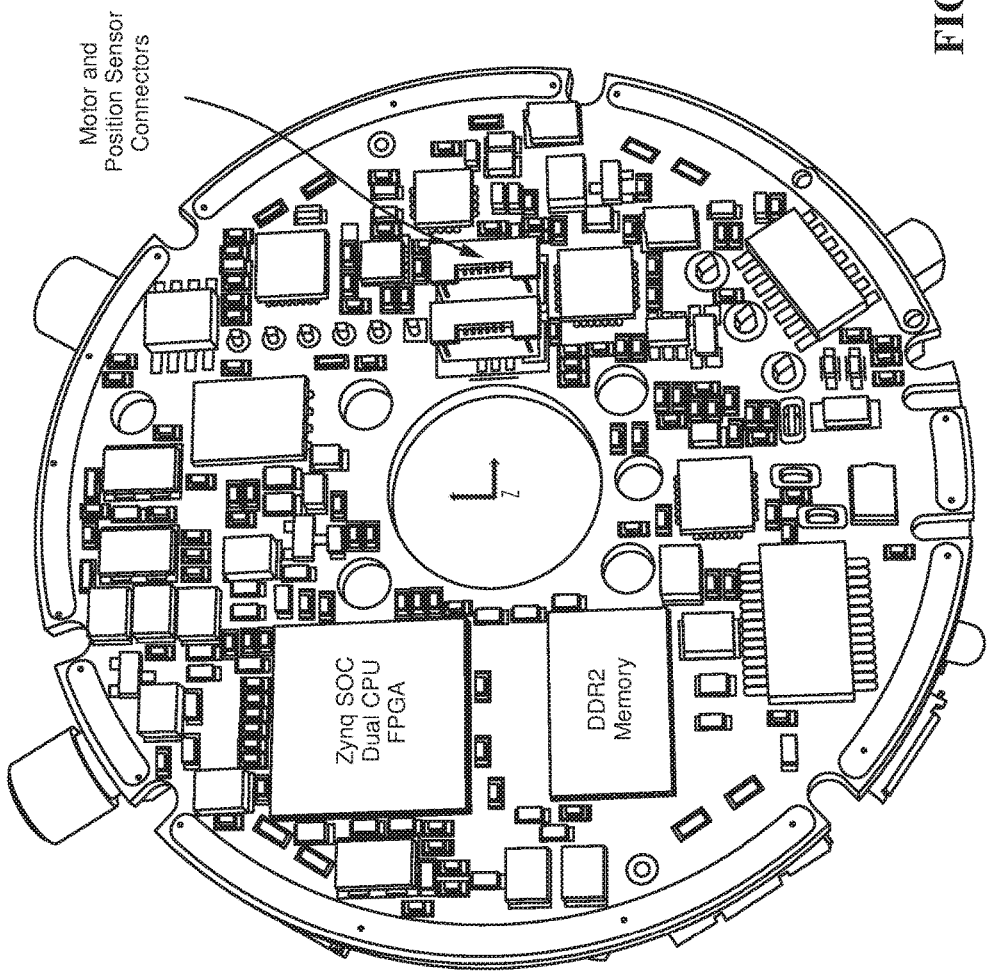

SMART MIRROR MOUNT DEVICE

PRIORITY CLAIM AND RELATED PATENT APPLICATIONS

This patent document claims priority to and benefits of U.S. Provisional Patent Application No. 61/930,042 entitled "SMART MIRROR MOUNT DEVICE" and filed on Jan. 22, 2014, which is incorporated by reference in its entirety as a part of this document.

TECHNICAL FIELD

This patent document relates to systems, devices, and processes for light beam and laser beam manipulations.

BACKGROUND

Mechanical manipulation of light or optical beams such as laser beams can be accomplished by a beam steering mirror through angular rotation or position translation of the mirror supported by a mirror mount. Some low cost manual mirror mounts for adjusting beam angles include a threaded screw pushing against a spring loaded plate holding the mirror, and, in operation, the screw can be turned manually to adjust for a precise mirror angle. Some low cost translation mirror mounts use a screw pushing against a spring loaded stage that can travel on bearings or slides, with the screw typically placed on the side of the mount.

In various designs, a motorized version of a mirror mount based on the above mentioned mounts uses a motor to drive the screw, or alternatively replaces the screw with a linear transducer for pushing the mirror plate. In implementations, the linear transducer can also be a piezoelectric device for achieving higher precisions but with a lower travel range.

In operation, mirror mounts can be adjusted in angle in a horizontal and a vertical direction, so as to redirect a beam precisely. FIG. 1 shows an example of a commercial mechanical mirror mount 100 that provides a mirror angle control via three adjuster screws to control the orientation of mirror holder with respect to a base plate.

A typical optical beam in various optical applications can be between a few millimeters to about a centimeter in diameter, and such a beam diameter allows a light beam in the visible or near infrared range to stay collimated over the distance of a laboratory table, e.g., a distance of several meters. The divergence angle due to diffraction is on the order of $\lambda/D$, where $\lambda$ is the wavelength of the light and D is the beam diameter. For light in the range of 1 µm in wavelength and a beam diameter of 1 mm, the natural beam divergence will be approximately 1000 microradians based on this formula. In various applications, the mirror alignment resolution may be a fraction of this divergence, or in the range of 10's microradians. Many commercially available mirror mounts work in this range with various capability for adjustment and stability, depending on mount material and design, as well as actuator properties, such as use of fine pitch screws and differential micrometers for finer resolution.

SUMMARY

Techniques, systems, and devices are disclosed for manipulating light beams using one or more motorized mirror mount assemblies communicatively coupled through a communication channel to each other or to an external device for sensing purposes, wherein the one or more motorized mirror mount assemblies provide an user interface, or connection to the internet cloud.

The subject matter described in this patent document can be implemented in specific ways that provide one or more of the following features. For example, the disclosed light beam manipulation system can use one or more communicatively coupled mirror mount assemblies to measure the wavelength of a light source by redirecting the light beam; to modify a light beam through light beam redirection, for example, for achieving power attenuation or optical path length adjustment; to perform light beam stabilization at a desired light output position and angle; to perform beam path alignment when more than one beam path exists; to enable wide angle range adjustment; and to enable high precision angular or linear position sensing applications.

In one aspect, a motorized apparatus for manipulating light beams is disclosed. This motorized apparatus includes a first mirror mount assembly that further includes a first mirror; a first mechanical mount supporting the first mirror; and a first motorized drive module coupled to the first mechanical mount to control rotation and position of the first mirror. The first motorized drive module also includes a first communication interface for communications with a device outside the first mirror mount assembly. The motorized apparatus also includes a second interface device, which can be a sensor, an user interface, a cloud connection, or a second mirror mount assembly which further includes a second mirror; a second mechanical mount supporting the second mirror; and a second motorized drive module coupled to the second mechanical mount to control rotation and position of the second mirror. The second interface device includes a second communication interface for communications with a device outside the second interface device. The motorized apparatus additionally includes a communication channel coupled between the first communication interface and the second communication interface to communicate information between the first integrated mirror mount assembly and the second interface device, which can in one example be a second integrated mirror mount assembly in directing a light beam from a light source to a desired light destination using the first and second integrated mirror mount assemblies.

In another aspect, a system for manipulation of light beams is disclosed. This system includes a mirror mount assembly that further includes a mirror; a mechanical mount supporting the mirror; and a motorized control module coupled to the mechanical mount to control rotation and position of the mirror. The motorized control module includes a communication interface. The system also includes an external control device including an user interface for allowing a user to control the mirror mount assembly. This system further includes a communication channel coupled between the communication interface and the external control device to communicate information between the integrated mirror mount assembly and the external control device in directing a light beam from a light source to a desired light destination using the mirror. The external control device can include a personal computer, a mobile phone, a tablet computer, or other mobile computing devices.

In yet another aspect, a method is provided for manipulating a light beam, which includes, directing a light beam from a light source onto a first mirror mount assembly; redirecting the light beam from the first mirror mount assembly onto a second mirror mount assembly; and redirecting the light beam from the second mirror mount assembly toward a desired light destination. The first mirror mount assembly and the second mirror mount assembly communicate information through a communication channel and collaborate with each other to direct the light beam from the light source to the desired light destination.

In yet another aspect, a mirror mount assembly for manipulation of light is disclosed. This mirror mount assembly includes a mirror; a mechanical mount supporting the mirror; a actuator mechanically coupled to the mechanical mount to provide a movement of the mechanical mount; a driver electrically coupled to the actuator to drive the actuator; and a control module electrically coupled to the driver to provide drive signals to the driver. The control module includes a processor for generating the drive signals and for autonomously implementing user defined functions on the mirror mount assembly. The mirror mount assembly also includes one or more communication interfaces coupled to the control module to receive one or more input signals from a first set of external devices and to transmit one or more output signals to a second set of external devices. The first set of external devices can include optical sensors such as for sensing power, pulse width, beam shape, camera image, beam position or wavelength, among other parameters, or non-optical sensors such as digital or analog inputs.

In yet another aspect, a method is provided for manipulating a light beam, which includes directing a light beam from a light source onto a mirror mount assembly that includes: a mirror; a mechanical mount supporting the mirror; an actuator mechanically coupled to the mechanical mount to provide a movement of the mechanical mount; and a driver electrically coupled to the actuator to drive the actuator; and a control module electrically coupled to the driver to provide drive signals to the driver. The control module includes a processor for generating the drive signals and for autonomously implementing user defined functions on the mirror mount assembly. The method also includes generating a control signal by the control module and redirecting the light beam from the mirror mount assembly toward a desired light destination by controlling the mechanical mount using the control signal. The control module can also take action based on information received from external sensors which can include optical sensors such as for power, pulse width, beam shape, camera image, beam position or wavelength, among other parameters, or non-optical sensors such as digital or analog inputs.

In yet another aspect, a capacitive sensor for determining an angular or linear position change is disclosed. This capacitive sensor includes alternating periodic pattern of metal lines or metal rings formed on a moving board and a mating pattern formed on a stationary board that has a gap from the moving board. The alternating periodic pattern and the mating pattern form a capacitance. The capacitive sensor is configured to measure a change in the capacitance when the moving board rotates or displaces with respect to the stationary board. The measured change in the capacitance is then used to determine an angular or linear position change between the moving board and the stationary board.

The above and other aspects and implementations are described in greater detail in the description, the drawings and the claims.

BRIEF DESCRIPTION OF THE DRAWINGS

FIG. 3 shows exemplary dimensions of a typically motorized mirror mount.

FIG. 19 shows the top component side of the exemplary integrated mirror mount assembly system.

DETAILED DESCRIPTION

Techniques, systems, and devices are disclosed for manipulating light beams using two or more motorized mirror mount assemblies communicatively coupled through a communication channel. In one aspect, a method for manipulating a light beam includes, directing a light beam from a light source onto a first mirror mount assembly; redirecting the light beam from the first mirror mount assembly onto a second mirror mount assembly communicatively coupled to the first mirror mount assembly; and redirecting the light beam from the second mirror mount assembly toward a desired light destination. The first mirror mount assembly and the second mirror mount assembly communicate information through a communication channel and collaborate with each other to direct the light beam from the light source to the desired light destination.

The subject matter described in this patent document can be implemented in specific ways that provide one or more of the following features. For example, the disclosed light beam manipulation system can use multiple communicatively coupled mirror mount assemblies to measure the wavelength of a light source by redirecting the light beam; to modify a light beam through light beam redirection, for example, for achieving power attenuation or optical path length adjustment; to perform light beam stabilization at a desired light output position and angle; to perform beam path alignment when more than one beam path exists; to enable wide angle range adjustment; and to enable high precision angular or linear position sensing applications.

Figure 1:
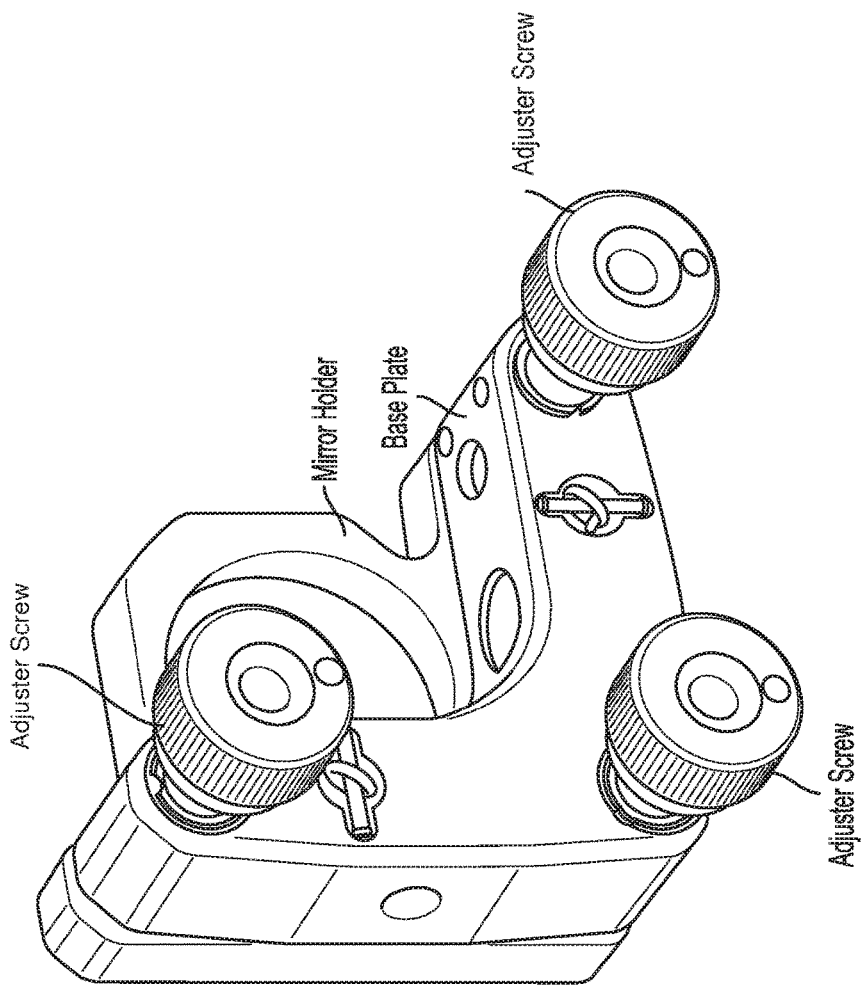
FIG. 1 shows an exemplary mechanical mirror mount for mirror angle control.
Figure 2:
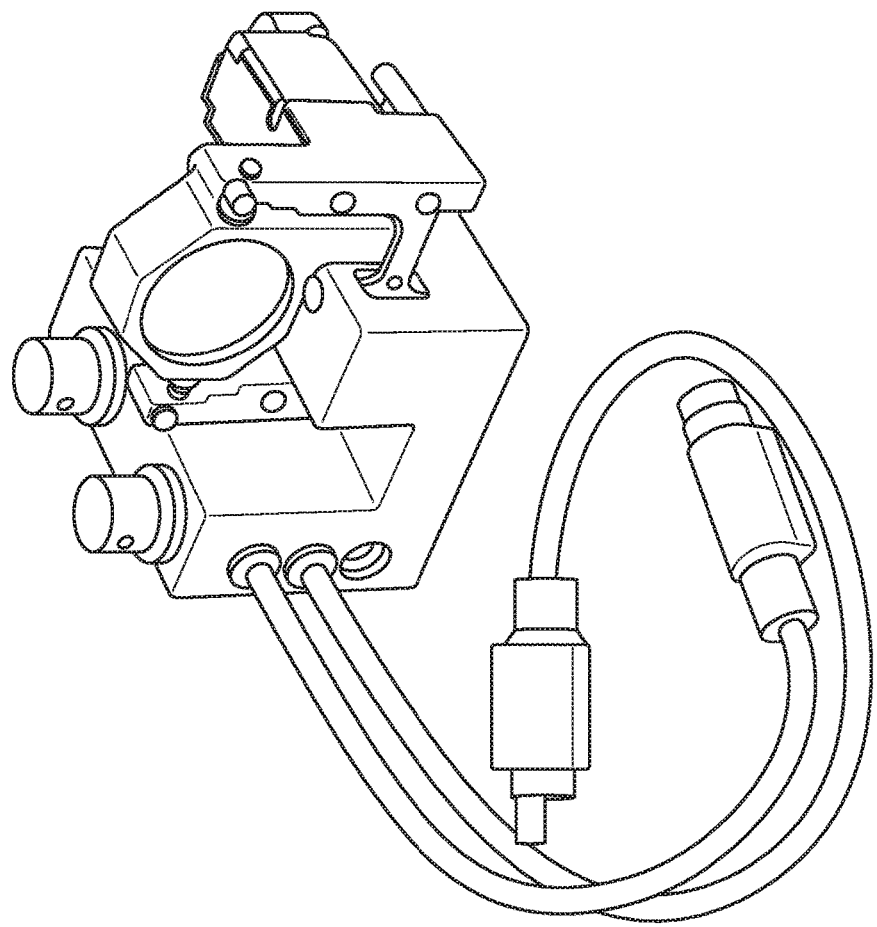
FIG. 2 shows an exemplary motorized mirror ("gimbal") mount for mirror angle control.

Motorized mirror mounts are similar to a manual mount, except that the screw is turned by an actuator using an electrical power to provide a linear actuation, such as by using a linear stepper motor. By using a piezoelectric actuation to provide the linear actuation, a high resolution but a small travel range can be achieved to tilt the mirror. FIG. 2 shows an exemplary motorized mirror ("gimbal") mount 200 for mirror angle control. FIG. 3 shows exemplary dimensions of a typical motorized mirror mount. A motorized mirror mount can use a stepper motor on a linear actuator to turn the mirror along a gimbal axis in a horizontal (also referred to as "azimuth") direction or a vertical (also referred to as "elevation") direction. Such a mirror mount is limited by the resolution of the motor step, which is typically only about 200 steps per rotation with fractional steps enabled. A DC motor can also be used to provide a wide range of resolutions, with the position determined by a rotary encoder on the rotating shaft. For precision positioning, the rotating shaft can be turned relatively slowly, e.g., in the range of 100 revolutions per minute (RPM). However, various commercial DC motors operate at relatively high rotation speeds (e.g., thousands of RPMs) and relatively low torques, thereby requiring a gear reduction assembly to provide the final output. Unfortunately, this gear train often adds backlash and wind-up to the control process. Lower cost rotary encoders which are based on reading optical or magnetic patterns on the circumference of a rotating shaft, are typically limited to under 100 counts per rotation. To enhance the resolution to the required level, this rotary encoder is usually attached to the motor shaft rather than the final shaft after the gear reduction. This configuration effectively increases the encoder resolution by the gear ratio, but also introduces error from backlash and other mechanical mechanisms. Higher resolution encoders up to 1,000,000 counts per rotation are available, but are typically larger at several centimeters diameter, and much more expensive, costing many 100s of dollars versus 10s of dollars for low resolution rotary encoders.

Motorized mirror mounts require a mechanism to electrically drive the actuator and control the mirror movement to a desired location. This mechanism is typically implemented by a separate driver box, which is often also configured to sense mirror position and drive the actuation mechanism such as a DC motor, a stepper motor, or a piezoelectric device. In some embodiments, this driver box contains a control mechanism to drive the mirror to a defined location according to a signal from an integrated sensor within the driver box. Alternatively, the driver box can use an external feedback mechanism, such as using an external sensor to define the desired mirror position.

Figure 4:
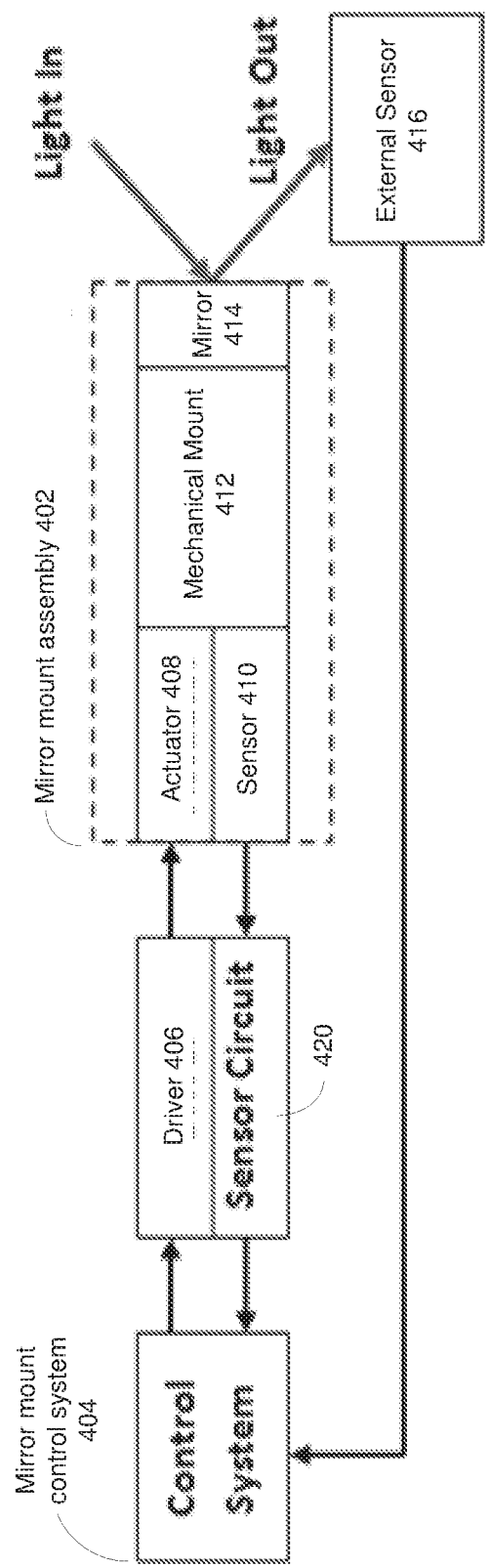
FIG. 4 shows an exemplary light beam manipulation system that includes a motorized mirror mount assembly and a mirror mount control system.

FIG. 4 shows an exemplary light beam manipulation system 400 that includes a motorized mirror mount assembly 402 and a mirror mount control system 404. In system 400, the control system 404 can include a microprocessor, a personal computer, a laptop computer, a tablet computer, a mobile phone, among others. System 400 also includes a driver 406 which includes electronics that can convert the desired control signals originated from control system 404 into pulses, voltages, or other signal forms needed to drive actuator 408 (e.g., a stepper motor, a DC motor, or a piezoelectric) inside motorized mirror mount assembly 402. In the exemplary system 400, control system 404 is separated from motorized mirror mount assembly 402 such that they are not integrated as a common package. For example, control system 404 may be coupled to motorized mirror mount assembly 402 through wired connection such cables or a wireless connection. Motorized mirror mount assembly 402 also includes a sensor 410, a mechanical mount 412, and a mirror 414. Sensor 410, which can be a position or rotation sensor or both, can include an optical or magnetic encoder. A sensor circuit 420 is provided to process the sensor output from the sensor 410. In one embodiment, the sensor circuit 420 for the sensor 410 converts pulses from the encoder into useful positioning information. The control system 404 then uses this information to position the mechanical mount 412 and mirror 414.

Some exemplary systems do not integrate the position or rotation sensor into the mirror mount assembly. In such a system, a feedback from one or more external sensors can be used to position the mirror mount. FIG. 4 also shows an external sensor 416 outside mirror mount assembly 402. When external sensor 416 is included, sensor 410 may be omitted. However, some embodiments of system 400 may include both integrated sensor 410 and external sensor 416. Similarly to sensor 410, external sensor 416 can generate feedback of different types representing the effect of the mirror mount assembly on an optical beam, wherein the feedback can be in optical or magnetic forms. In some embodiments, however, no electronic feedback, or a closed loop, is used. In such embodiments, the user controls the mirror mount manually in an open loop, for example, by using visual indications available to the user.

Figure 5:
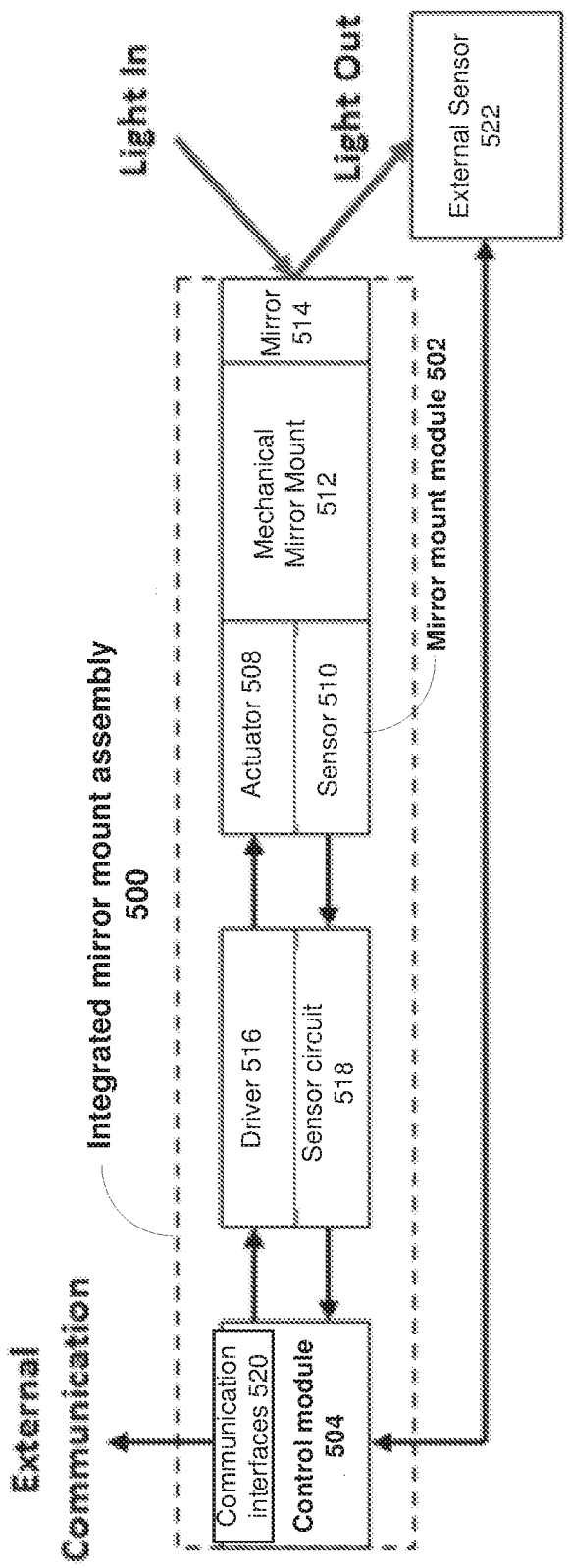
FIG. 5 shows an exemplary system for mechanical manipulation of light beams.

FIG. 5 shows an exemplary system having an integrated mirror mount assembly 500 for mechanical manipulation of light beams. Integrated mirror mount assembly 500 includes a motorized mirror mount module 502 and a control module 504 integrated as a single integrated mirror mount assembly 500, wherein motorized mirror mount module 502 further includes an actuator 508, a sensor 510, a mechanical mirror mount 512 and a mirror 514. Moreover, integrated mirror mount assembly 500 includes a driver 516 and sensor circuitry 518 coupled between mirror mount module 502 and control module 504. In some embodiments, integrated mirror mount assembly 500 can incorporate processors, such as single core CPUs, multi-core CPUs, or field-programmable gate arrays (FPGAs) within control module 504.

Sensor 510 within integrated mirror mount assembly 500 is an integrated sensor coupled to the mechanical mount 512 to detect an angular or linear position change of the mechanical mount 512. The integrated sensor 510 is electrically coupled to the control module 504 to provide feedback signals to be processed by the control module 504 for adjusting angle and position of the mirror 514. FIG. 5 also shows an external sensor 522 outside integrated mirror mount assembly 500 which is coupled to control module 504. Similarly to sensor 510, external sensor 522 can generate feedback of different types to detect an angular or linear position change of the mechanical mount 512 and mirror 514. However, external sensor 522 is not part of mirror mount assembly 500 and is optionally used with mirror mount assembly 500. In some implementations, more than one external sensor 522 can be provided to interface with the control module 504. In some implementations, the multiple external sensors 522 can include optical sensors such as for sensing power, pulse width, beam shape, camera image, beam position or wavelength, among other parameters, or non-optical sensors such as digital or analog inputs.

Integrated mirror mount assembly 500 can also incorporate one or more communication interfaces coupled to the control module 504 for coupling to an external communication network through a wired or a wireless communication channel. In integrated mirror mount assembly 500 shown in FIG. 5, these communication interfaces are implemented as communication interfaces 520 within control module 504. Communication interfaces 520 include electronic circuits designed in specific standard to enable integrated mirror mount assembly 500 to communicate with external devices such as a microcontroller, a PC, a laptop, a tablet, a mobile phone, or another similar integrated mirror mount assembly. In other embodiments, communication interfaces 520 are coupled to but not part of control module 504.

In some embodiments, communication interfaces 520 is configured to receive one or more input signals from a first set of devices external to integrated mirror mount assembly 500 and to transmit one or more output signals to a second set of devices external to integrated mirror mount assembly 500. In some embodiments, communication interfaces 520 include one or more digital interfaces to couple to power sensors, position sensitive detectors, knobs for position control, or Bluetooth, or ZigBee or WiFi interfaces. In some embodiments, a reconfigurable FPGA is used to control the one or more digital interfaces. In some embodiments, communication interfaces 520 include one or more USB interfaces to couple to cameras, USB controlled instruments such as spectrometers, or WiFi adaptors. The USB interfaces are configured to control one or more USB devices plugged into USB ports by loading proper software drivers for the one or more USB devices.

Integrated mirror mount assembly 500 is a single compact, intelligent assembly with interconnected components shown in FIG. 5. Integrated mirror mount assembly 500 can be manufactured with low cost and can reliably deliver performance equivalent to the top of the line mounts on the market having separate controllers. In some embodiments, integrated mirror mount assembly 500 is a master mirror mount assembly, and the control module 504 in this master mirror mount assembly is configured to control one or more slave mirror mount assemblies through communication interfaces 520. Integrated mirror mount assembly 500 can also be configured to communicate with an external user interface, an Internet cloud, or a laboratory instrument through the one or more communication interfaces.

Integrated mirror mount assembly 500 can generate a user interface which can be interpreted internally by mirror mount assembly 500. In one embodiment, an external knob on one of the multiple possible digital interface lines within communication interfaces 520 can be interpreted by the on board processor to control the motors and position in various directions and sensitivities depending on the knob position and buttons pressed on the external control. In yet another embodiment, integrated mirror mount assembly 500 provides a text based interface via a serial port, where the control module 504 can provide options that the user can choose from, such as align, measure power, measure temperature, and so on. In yet another embodiment, with a WiFi interface via the USB or digital interfaces, integrated mirror mount assembly 500 can generate web pages that can be transmitted to any external web browser for user information and control.

The fully integrated architecture of system 500 in FIG. 5 offers many new possibilities for manipulating optical beams. The disclosed communication interface 520 of system 500 allows system 500 to communicate with an external communication network, other similar devices, control systems, or sensors.

Figure 6:
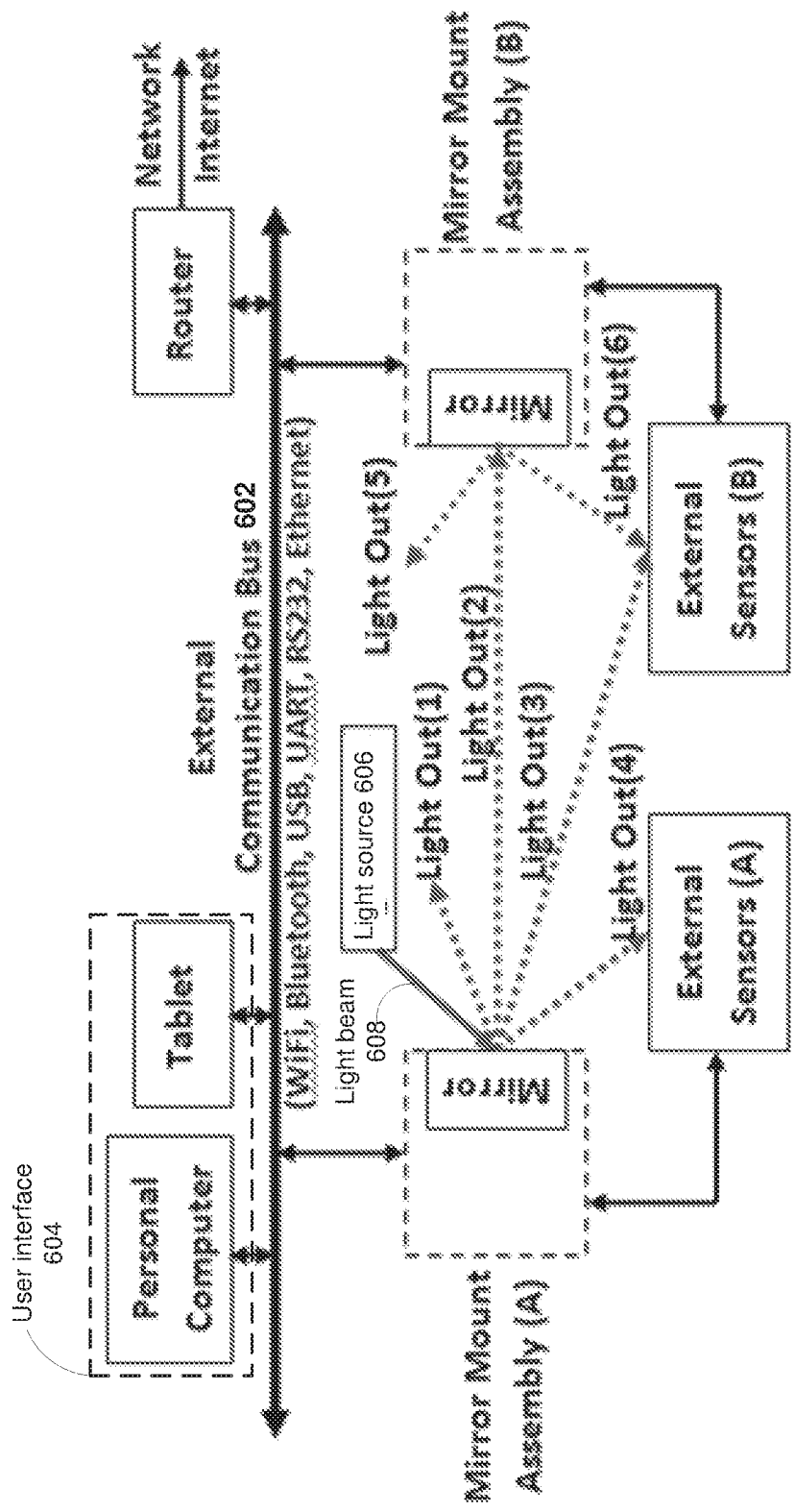
FIG. 6 shows an exemplary system that combines at least two integrated mirror mount assemblies for manipulating light beams.

FIG. 6 shows an exemplary system 600 that combines at least two integrated mirror mount assemblies for manipulating light beams. More specifically, system 600 includes a first integrated mirror mount assembly (A) and a second integrated mirror mount assembly (B). Each of the two mirror mount assemblies (A) and (B) may be substantially similar to the integrated mirror mount assembly 500 in system 500 described-above, but can also include fewer or more components than integrated mirror mount assembly 500. For example, each of the mirror mount assemblies (A) and (B) can include a mirror mount module which further includes an actuator, one or more sensors, a mechanical mirror mount and a mirror. Each of the mirror mount assemblies (A) and (B) can also include a control module, a driver, and a sensor circuit. Moreover, each of the mirror mount assemblies (A) and (B) can have a communication interface and multiple external sensors. System 600 also includes a communication channel external to both mirror mount assemblies (A) and (B), which may be implemented as the external communication bus 602 in FIG. 6. The external communication bus 602 is coupled between the two mirror mount assemblies (A) and (B), for example, through the respective communication interfaces of the mount assemblies (A) and (B). System 600 also includes a user interface 604 coupled to the external communication bus 602 in form of a personal computer, a tablet, a mobile phone, etc., which can be used to manipulate a light beam from a light source to a desired light destination by controlling one or both of the mirror mount assemblies (A) and (B).

As shown in FIG. 6, a light source 606 emits a light beam 608 which is incident on mirror mount assembly (A). Light source 606 can include a lamp, a LED, a laser pointer, or a high power laser system, among others. Mirror mount assembly (A) can then redirect light beam 608 to multiple other locations of value to system 600. For example, light beam 608 can be directed to other external optical systems or instruments as indicated by light beam "Light Out (1)".

Furthermore, light beam 608 can be directed as indicated by light beam "Light Out (4)" to one or more sensors (A) which are electrically coupled to mirror mount assembly (A). Such sensor or sensors can be used to provide information of the beam position, angle, wavelength, beam shape, beam size, divergence, power, pulse width, or other beam properties. These sensed properties by one or more sensors (A) can also be used as part of feedback control in system 600.

Light beam 608 can be directed as indicated by light beam "Light Out (2)" to the second mirror mount assembly (B). The second mirror mount assembly (B) can then in turn direct the beam to additional sensors, external instruments, or yet more mirror mount assemblies C, D, E, etc. . . . not shown in FIG. 6. Hence, in addition to mirror mount assemblies (A) and (B), system 600 can include additional mirror mount assemblies, each of which can be substantially similar to mirror mount assemblies (A) and (B).

One important property of the disclosed technology is to provide a communication channel to communicatively coupled multiple mirror mount assemblies and to communicatively coupled mirror mount assemblies and other devices, wherein the communication channel can be connected to a communication network. This communication channel can be implemented in one of the known communication network bus such as Bluetooth, Universal Serial Bus (USB), UART (serial communication), RS232, WiFi, ZigBee, or Ethernet or a combination of these networks. The communication channel can be a wired communication channel (such as USB, RS232, UART, or Ethernet) or a wireless communication channel (such as WiFi, Bluetooth, or ZigBee). A wired communication channel typically has reduced radiation noise, whereas a wireless communication channel typically has more convenience without the need to connect a wire.

In some embodiments, each mirror mount assembly in system 600 may be configured to function autonomously according to a user defined program stored on the mirror mount assembly to redirect a light beam without feedback or control from external elements. However, the proposed external communication channel can greatly enhance the functionality of the mirror mount assembly in several ways.

First, the communication channel can be coupled to a user interface or a common control system such as a personal computer, tablet, or a cell phone. Through the communication channel, the user interface or the common control system can allow user control of multiple mirror mount assemblies, either separately or in concert in their movement to achieve a desired objective in beam placement, size, power, or measurement.

Second, by communicating between similar mirror mount assemblies through the proposed external communication channel, such as between mirror mount assembly A and mirror mount assembly B in FIG. 6, additional useful functions can be achieved. For example, if the mirror mount assemblies are rotation mounts, then two mounts can enable finer control of beam positions and angles than a single mirror mount assembly. One example is shown in FIG. 6, where the first mirror mount assembly (A) directs light beam 608 to a desired position on the second mirror mount assembly (B) as indicated by light beam "Light Out (2)," wherein the mirror mount assembly (B) in turn directs the beam "Light Out (2)" at a desired output angle as indicated by light beam "Light Out (5)." The communication channel 602 can allow the mirror mount assemblies (A) and (B) to determine the distance between the mirror mounts and sensors based on mirror movement and external position sensors, for example, by mathematically solving the various combinations of mirror movement that place a beam at the specific locations on the sensor.

In another exemplary use of the communication function between similar mirror mount assemblies, if mirror mount assembly (A) directs the beam to mirror mount assembly (B), as indicated in "Light Out (2)," which in turn directs the beam, as indicated in "Light Out (6)," to an external sensor (B) with including electronic feedback to mirror mount assembly (B), then useful information can be transmitted back to mirror mount assembly (A) for use in feedback control of assembly (A). This ability for mirror mount assemblies to communicate between themselves on a communication channel, or a communication network can allow multiple sensors to be used or shared by multiple mirror mount assemblies. Furthermore, the information collected by the multiple sensors from the multiple mirror mount assemblies can be consolidated by the network into one common location on a personal computer, a cell phone, a tablet, or a particular mirror mount assembly designated as the master. This consolidated sensor information can provide user feedback or provide a basis for system control purposes.

The fully integrated mirror mount assembly as described in FIG. 5 and the integrated system with communication functions as described in FIG. 6 offer advances in new ways for performing optical beam manipulation and sensing.

For example, using the ability of the fully integrated mirror mount assembly of FIG. 5 to redirect a light beam to different output locations, the assembly can be used to couple multiple different light sources to multiple light destinations, each of the light sources can be a lamp, LED, laser pointer, or high power laser system. Each of the light destinations is a desired location for the light beam and can be: a sensor such as an optical power meter, spectrometer, camera, beam position sensor, light power splitter or other optical element; a target element for processing; or light output external to the system.

Figure 7:
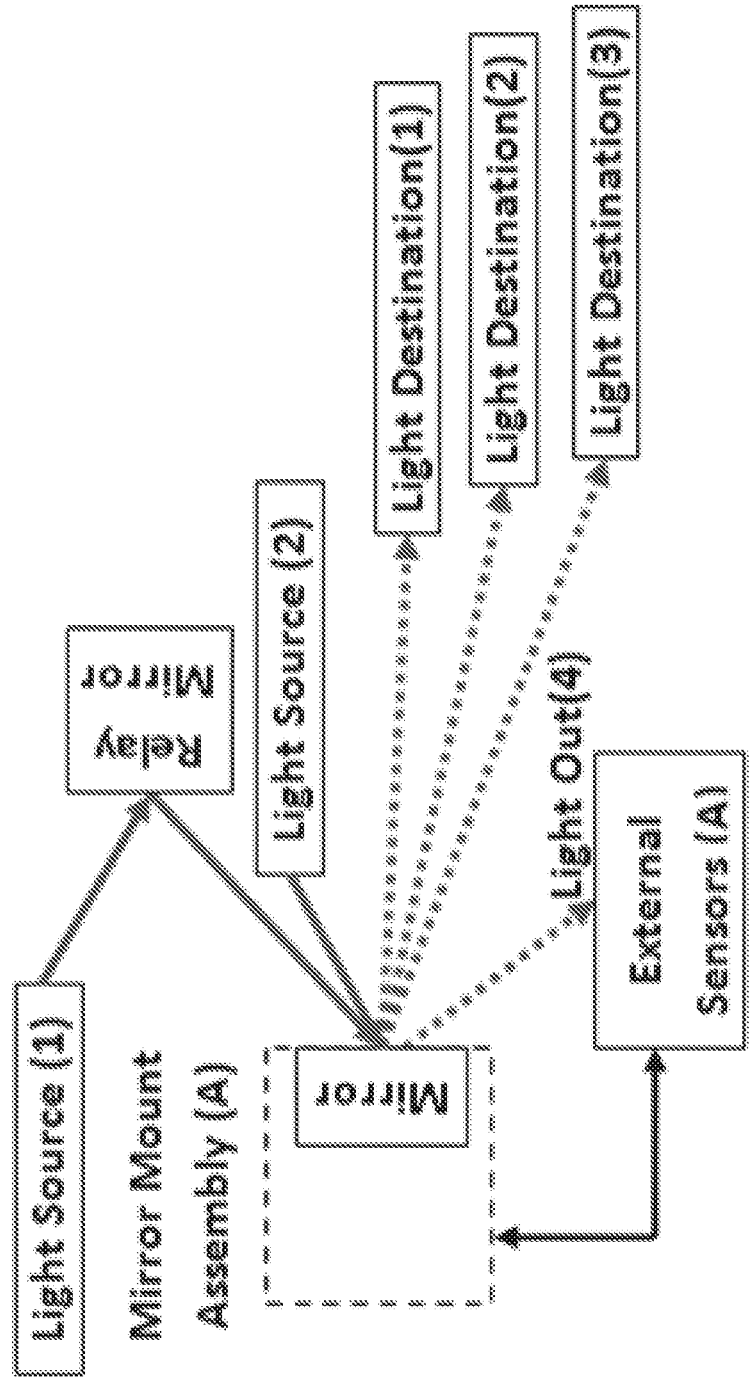
FIG. 7 shows an exemplary optical redirection system which uses both a relay mirror and a mirror mount assembly to redirect a light beam from a light source.

By using a proper optical setup, and repositioning of the mirror, a light beam can be directed from any light source to a desired light destination. Typically, the optical setup requires that the light source and the light destination can directly "see" the mirror on a mirror mount assembly or indirectly through a relay of mirrors. The optical setup often also requires that the angle between any given light source and light destination is sufficiently less than 180 degrees so that the beam diameter will project onto the mirror without excessive loss from overfill of the mirror. If the angle between a light source and a light destination is excessive, additional relay mirrors can be placed at a location which allows a shallower angle between the these elements, but at the expense of optical loss on the multiple mirrors, and the cost of the relay mirror elements. FIG. 7 shows an exemplary optical redirection system 700 which uses both a relay mirror and an integrated mirror mount assembly (A) to redirect a light beam from light source (1).

In another exemplary use of optical redirection system 700 illustrated in FIG. 7, system 700 can direct the light from light source (1) to one or more external sensors (A) that are electrically coupled to the mirror mount assembly (A). Note that these external sensors (A) can also be included into a common package with the mirror mount assembly (A). The external sensors (A) can be used to measure optical power, spectrum, beam profile or quality, pulse width, beam position, or other optical properties.

In yet another exemplary use of optical redirection system 700, a reference beam such as a laser pointer can be used as one of the light sources. Each of the light destinations can be aligned using this reference source. If the location of the mirror in mirror mount assembly (A) is then determined independently through an encoder or other position sensor upon final alignment, then the light destination beam position can be determined by using the light source and mirror locations. Specifically, the light reflected on the mirror in mirror mount assembly (A) makes a deflection angle double that of the angle between the normal to the mirror plane and the light source. If the position of the mirror surface is known relative to the beams, then the light destination beam position is also known using standard geometric projection. One technique to calibrate the angle of the reference beam is to redirect the beam back up on itself, which requires the normal to the mirror be aligned with the reference beam angle, while the mirror position is sensed independently by an encoder or other position sensor. The direct return reflection can be sensed visually, or directly within many reference beam sources by a change in drive current or internal optical power, as the reflection from the aligned mirror becomes parallel to any mirror in the reference beam source.

Another technique to calibrate the reference beam position is to use an external sensor with a camera or position sensitive detector. Furthermore, manual alignment of a reference beam to a light destination can be made easier by using a beam in the visible part of the spectrum. This reference beam can also have a chopped signal at a low frequency for better visual identification, or modulated a higher frequency to discriminate from other optical sources in the system. The reference beam can also be directed to back propagate onto one of the other Light Sources. In this manner, the position of the light source beam and the light destination can be known based on a common reference beam. With this information, the mirror in the integrated mirror mount assembly (A) can be independently positioned at a known intermediate position to direct a calibrated light source to a calibrated light destination.

Measuring Light Beam Wavelength by Redirection

Figure 8:
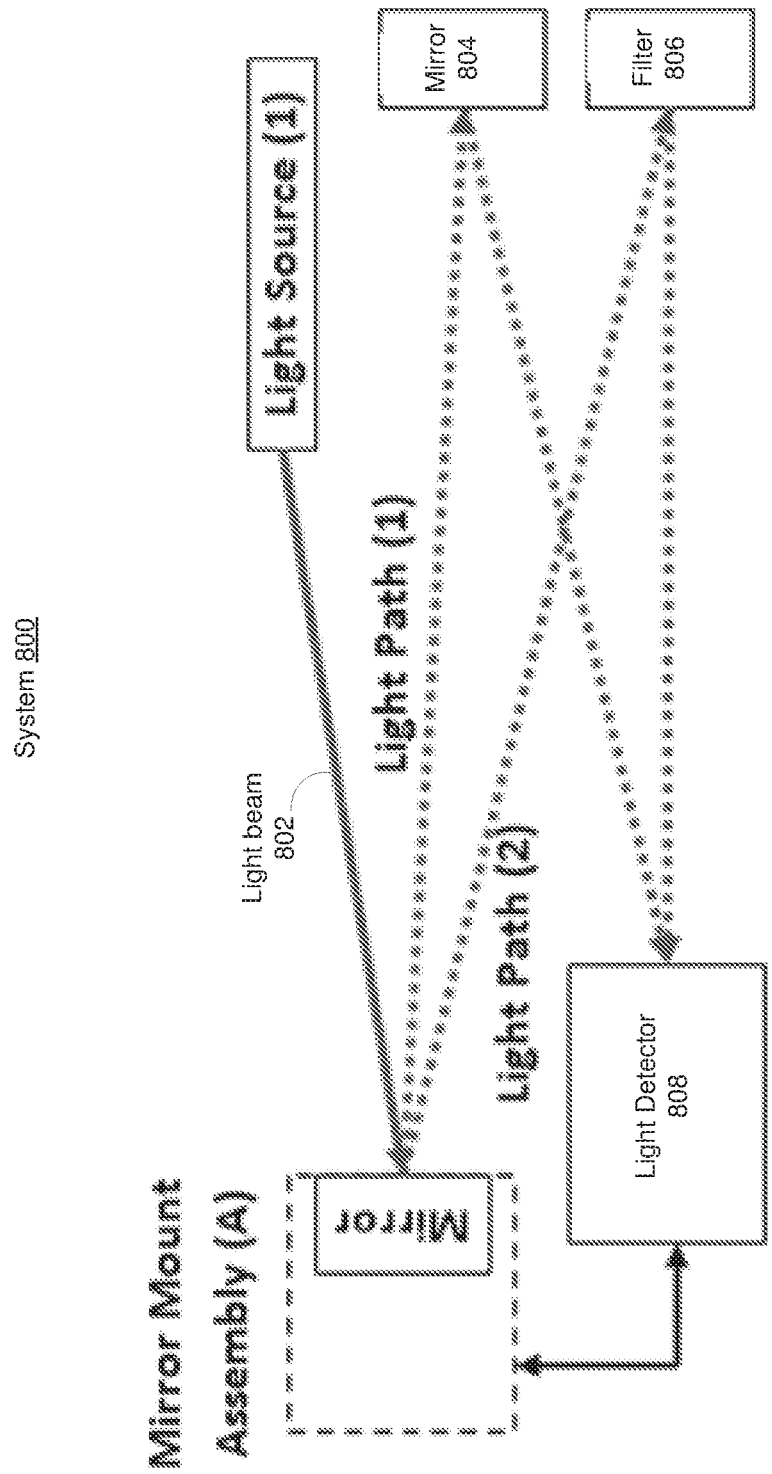
FIG. 8 shows an exemplary system for measuring the wavelength of a light source.
Figure 9:
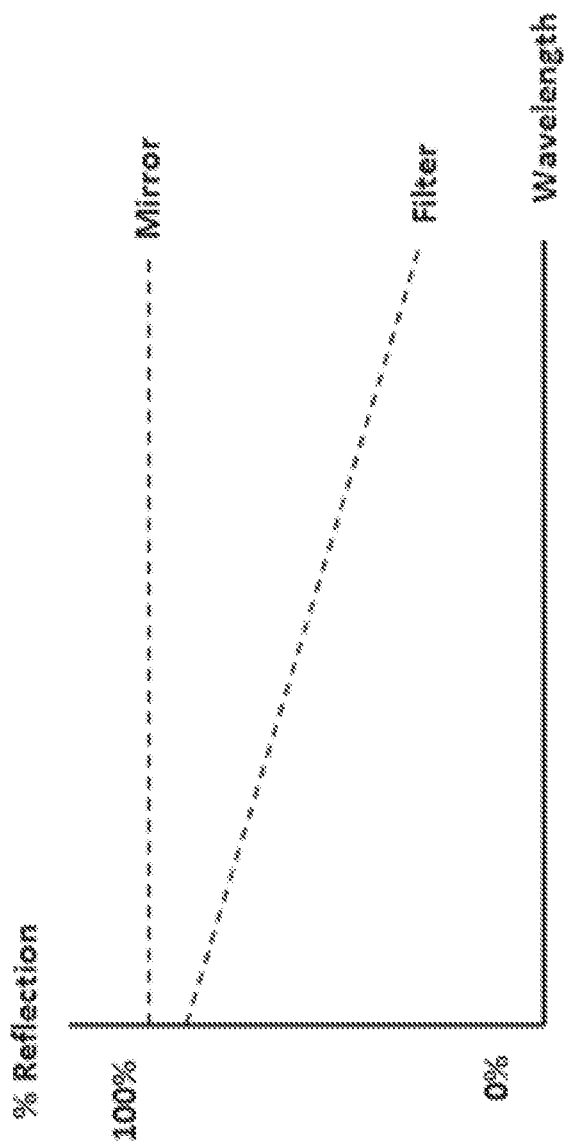
FIG. 9 shows exemplary spectral responses of the reflection coefficient of a mirror and a filter.

FIG. 8 shows an exemplary system 800 for measuring the wavelength of a light source. In the example of FIG. 8, a light source (1) to be measured emits a light beam 802 which can be directed to one of two reflection elements. One reflecting element is a broad band mirror 804 with relatively flat spectral response. The other reflecting element is a filter 806 which has a reflection that depends on the wavelength of the incident light. FIG. 9 shows exemplary spectral responses of the reflection coefficient of a mirror and a filter. As can be seen in FIG. 9, a mirror has a flat spectral response, while a dielectric reflection filter has a reflection that depends on the wavelength. Returning to FIG. 8, each reflecting element is then configured to direct the reflected beam to be incident on a light detector 808. While a single light detector is shown in FIG. 8 to measure both of the reflected beams, other embodiments can use independent light detectors to provide enhanced calibration capability. The wavelength of the light source (1) can then be determined by the ratio of the measured power compared to the calibrated spectral response of the two reflection elements.

In some embodiments, the filter element 808 in system 800 can be made by a conventional dielectric mirror technology, using layers of dielectric materials deposited sequentially. Moreover, the spectrum of the reflection can have any form, not necessarily linear as shown in FIG. 9, as long as the filter reflection versus wavelength relationship is sufficiently unique to discriminate different wavelengths. If the light detector 808 is a camera, then a spatially varying filter can allow a spectrum of the light source to be measured. A dielectric filter can be made with spatial non-uniformity by deposition at an angle from the deposition source during layer creation. Also note that the filter 806 can be used in a transmission mode, with the transmitted beam directed to a light detector. Furthermore, in another approach, the light beam 802 does not need to be redirected by mirror mount assembly (A). Instead, the light beam 802 from light source (1) can be first split with standard fixed optical elements, with each of the split beams directed separately to the mirror 804 and the filter 806, and then to separate light detectors. However, this approach using fixed optical elements requires many more optical, mechanical, and sensor elements, and does not permit the flexibility to measure multiple independent light sources automatically.

Light Beam Modification by Redirection

For measurement and effective use of a light source, the light beam from the light source often needs modification. For example, the optical power of the light beam may be excessive for damage tolerance or accurate measurement using an instrument at the light destination, requiring the beam to be attenuated. Also, the light beam may not be of proper diameter or other properties of the light beam may not be ideal for a particular application. While a fixed element may provide these modifications, such a fixed element is not suitable for applications where multiple beam properties are needed at multiple locations or to vary in time. Furthermore, the light source may have a change in a property, such as power or wavelength, and require an adjustment in the property of the light arriving at the light destination.

Figure 10:
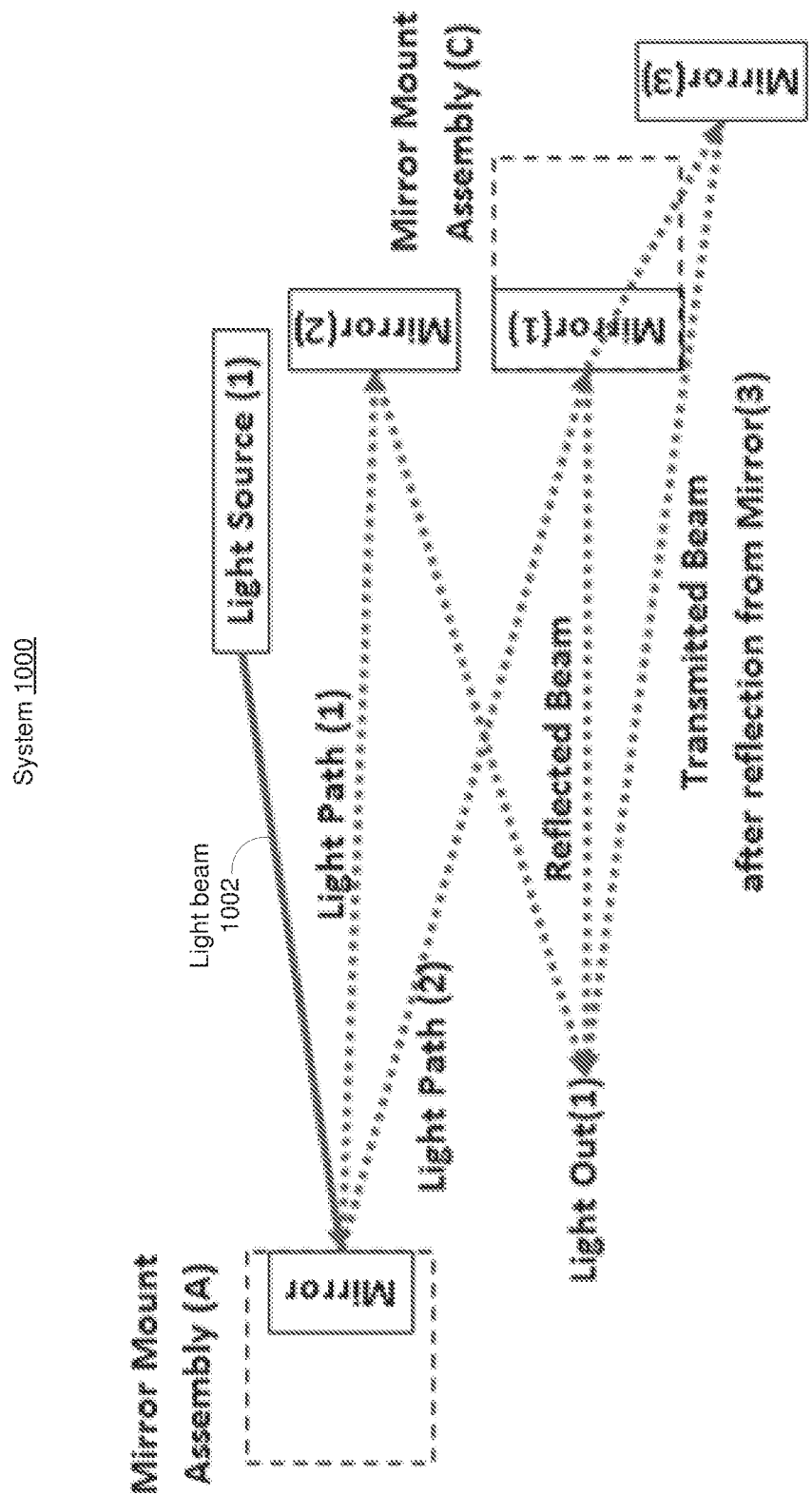
FIG. 10 shows an exemplary system for light beam modification by redirection.

In a disclosed technique, the light beam can be modified by redirection to an optical element that provides the required modification. One example of a useful modification is attenuation of the optical power of the light beam. FIG. 10 shows an exemplary system 1000 for light beam modification by redirection. More specifically, system 1000 includes an integrated mirror mount assembly (A) which can be substantially similar to the integrated mirror mount assembly 500 described in FIG. 5, a light source (1), and mirrors (1), (2), and (3). In the example of FIG. 10, one of two different attenuation factors can be selected by directing the light beam 1002 to one of two mirrors, Mirror (1) and Mirror (2), which have different attenuation factors. These mirrors in turn direct the light beam to a common output point indicated as "Light Out (1)."

In some embodiments, one of the mirrors is a high reflectivity metal or dielectric mirror if full power is required for one of the two reflected beams. An attenuating mirror can include any reflection surface having a lower reflection in order to attenuate the incident beam. A common and inexpensive technique for attenuating a beam is to use the Fresnel reflection that occurs at the boundary of air and a substance such as glass. A typical polished glass surface will have approximately a 4% reflection. The back side of such a glass element is typically at an angle to the front surface, or "wedged" in order to prevent interference from the surfaces. The back surface can also be anti-reflection coated. The front side of the attenuator element can be further coated with a dielectric layers to enhance or reduce the reflection. This attenuating element also has a reflection and transmission that depends on angle. In the embodiment shown in FIG. 10, attenuation mirror (1) is placed in a separate integrated mirror mount assembly (C) to allow adjustment of the relative power transmitted or reflected by mirror (1) by adjusting the angle of incidence onto the surface of mirror (1). Mirror mount assembly (C) can be substantially similar to mirror mount assembly (A).

Because the reflected light varies in angle, and is difficult to be recaptured, the transmitted light may offer simpler integration into the optical path. This transmitted light through mirror (1) is shown in FIG. 10 to be directed toward mirror (3). This light is then redirected to the common point of Light Out (1) by mirror (3).

Figure 11:
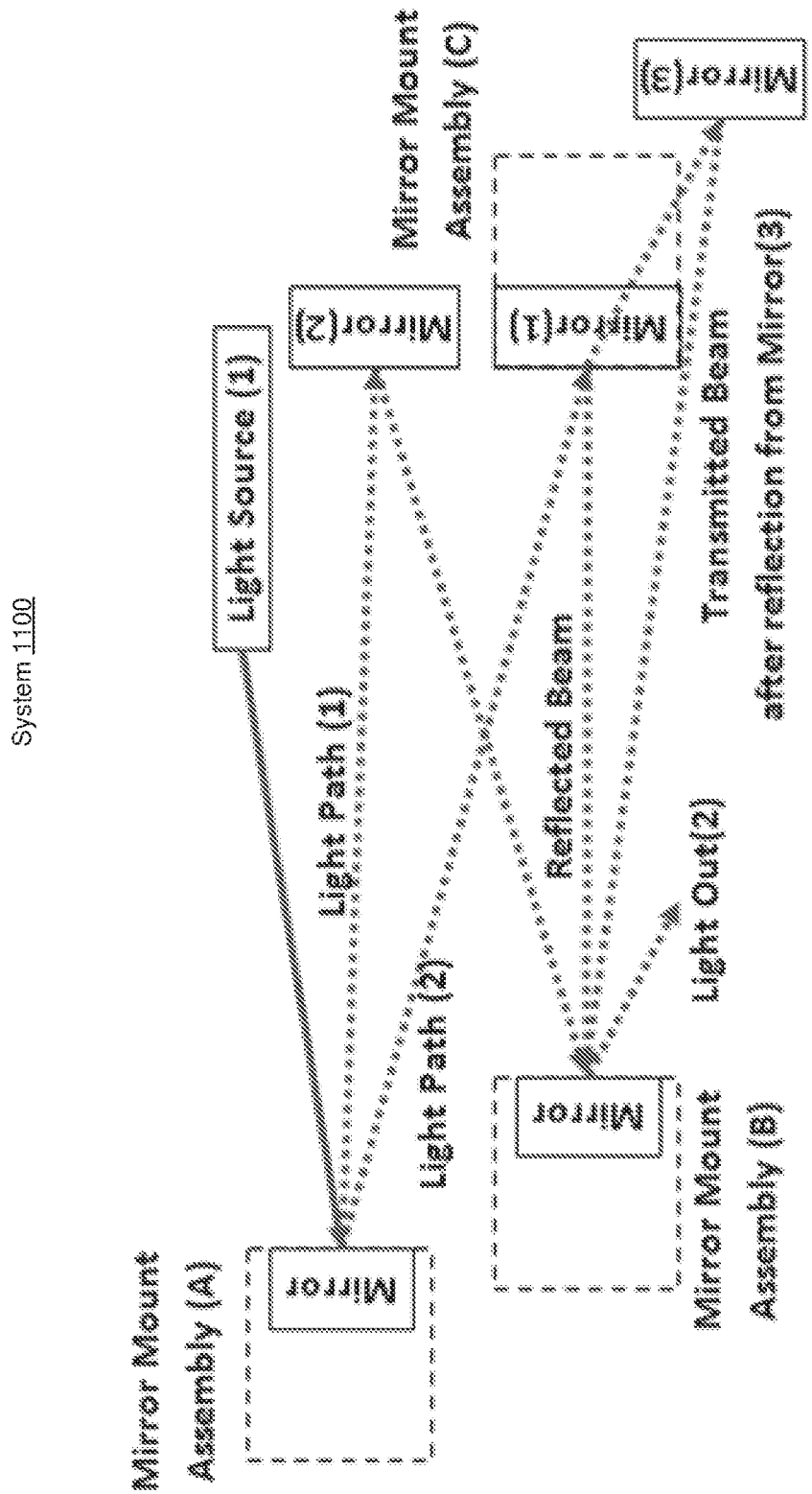
FIG. 11 shows an exemplary system which provides an improved light beam modification by redirection over the system of FIG. 10.

The technique described in FIG. 10 provides output light at a common point Light Out(1). However, the directions of the incident lights are different for the different light paths reflected by the different mirrors. FIG. 11 shows an exemplary system 1100 which provides an improved light beam modification by redirection over the system of FIG. 10. In this technique, the final output light indicated by "Light Out(2)" is redirected by another integrated mirror mount assembly (B) which is configured to ensure that the output beams are in a common direction. This technique requires the mirror mount assemblies (A), (B), and (C) communicate with each other so as to work in coordination for each attenuation state.

Another beam modification technique by redirection includes adjusting the optical path length by redirecting a beam to optical paths with various distances of travel. As a beam propagates, the beam diameter, phase curvature, and other properties will change due to diffraction and other optical phenomena. Referring to FIG. 11, by redirecting the beam to reflecting surfaces at various distances, different points along the beam path indicated by Light Out (2) can be selected. In this case, mirror (1) and mirror (2) in FIG. 11 can be placed at different distances from integrated mirror mount assemblies (A) and (B), so that the total optical path lengths of the reflected beams by mirror (1) and mirror (2) are different by the required amount.

By choosing multiple points along the propagation direction, a beam quality measurement known as the $M^2$ measurement can be obtained. Because an $M^2$ measurement for the beam quality involves two groups of measurements, with one set of points near the focus, and another set in the field farther from the focus, it may be possible to perform this measurement using only two separate redirections, along with optical elements for additional measurements at points along the travel locally. For example, a local set of measurements can include using an optical wedge and camera so the beam bounces multiple times within the wedge, with each bounce emitting a beam at slightly different path length, and creating a separate image on the camera that can be independently measured.

The above-described exemplary systems of FIGS. 10 and 11 only show two redirections of a light beam. However, the general concept of using multiple communicatively coupled mirror mount assemblies in collaboration to direct light beams can be extended to a plurality of beam redirections for multiple adjustments of beam properties.

Light Beam Stabilization

The disclosed integrated mirror mount assembly can also be used to stabilize a light beam at a desired light output position and angle, or onto a desired light destination. The stabilization can be accomplished in various ways using a combination of electronic position sensors and optical beam sensors.

Beam drift in position and angle can occur due to many factors, including the light source variations, table warp, mounting wobble, mount stability, mirror mounting stability, ambient temperature change, and many other factors. Most of these factors are slowly varying, and temperature change usually plays a major role in beam drift within most optical systems. In some embodiments, by integrating a microprocessor at the base of a mount, the temperature of the mount can be monitored and stabilized by adjusting power dissipation of the processor, for example, by executing dummy functions in the processor, by adding extra computing cycles, or reading and writing data to a memory. At a higher angular precision, in the microradians and less for example, air flow, vibrations, and other factors can cause high frequency variations in the 100s of Hz and higher. However, beam drift in the 10s of microradians and larger typically occurs at slower rates, in the 10s of Hz and less, sometimes occurring over several hours as the instrument, room or table warm up during the day.

A beam stabilization requirement is typically based on a tolerance level within a fraction of the beam's diameter and divergence. For typical mirror mounts with ~1-inch diameter, the beams are usually under 10 mm in diameter, and typically in the 1 to 10 mm diameter range. The diffraction of a 10 mm beam with 1 µm wavelength is approximately 1 µm/10 mm=100 microradian, as discussed previously in the background section. For a multimode beam, an incoherent beam, or a smaller diameter beam, the diffraction divergence is often greater. As such, a typical beam can be stabilized to within 10% of its minimum divergence and beam diameter with a 10 microradian angle and 100 µm position resolution. To satisfy these tolerances, a low frequency stabilization solution, which is usually under 100 Hz, is often adequate.

Figure 12:
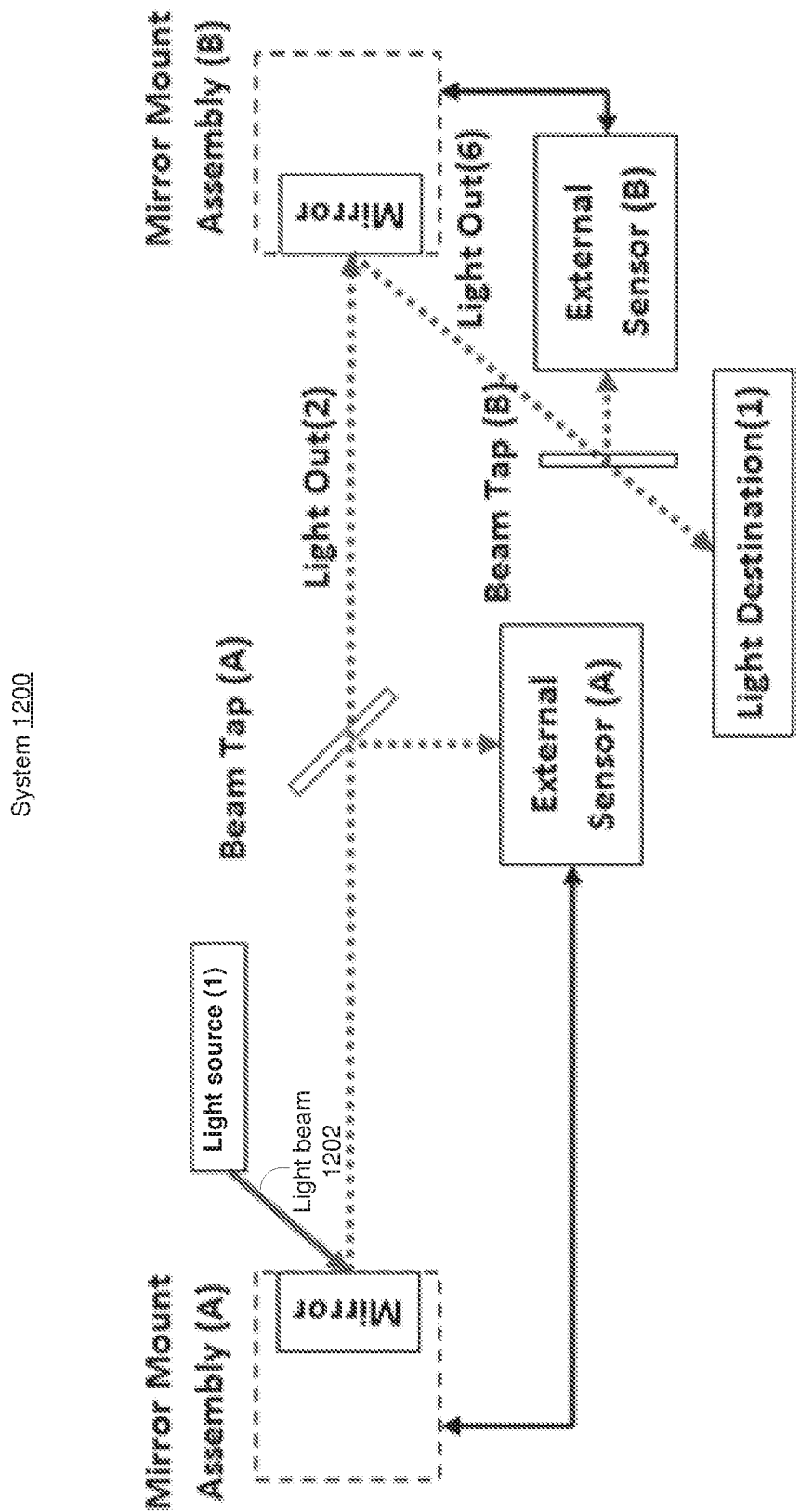
FIG. 12 shows an exemplary system for light beam stabilization.

For beam angle stabilization, one technique is to place a beam position sensor at some distance from the mirror mount assembly to sense the beam after the beam reflecting off the mirror, and then use the mirror angle adjustment to maintain the position. FIG. 12 shows an exemplary system 1200 for light beam stabilization. As shown in FIG. 12, system 1200 includes an integrated mirror mount assembly (A) and an external sensor (A) to provide the stabilization function. In this technique, the external sensor A can be a position sensitive detector, such as Hamamatsu 55990, or a CCD or CMOS camera that can resolve the beam structure. The position sensitive detector can generate multiple currents that can be processed using various mathematical models to derive a beam position in horizontal and vertical directions. A typical position resolution of the Hamamatsu 55990 is under 1 µm, easily meeting typical requirements for position stabilization. If the sensor is placed a distance of 10 cm or more from a point of angle drift, then the angle resolution, assuming the position remains fixed, is less than 10 microradians, also meeting the needed angle resolution discussed above. The resolution of a CCD or CMOS camera is limited by the pixel size of each sensor element within the camera array. The pixel size depends on the size of the camera sensor chip, and the overall number of pixels. The pixels can typically vary from 3 to 20 µm in size. With some interpolation and averaging, the beam center position can typically be determined within 10% to 30% of the pixel size, or in the range of one micrometer, with similar resolution as the position sensitive detector.

As shown in FIG. 12, the external sensor (A) for beam position detection can be fed back to the integrated mirror mount assembly (A), which then uses this information to adjust the mirror angle in an opposite direction to the detected movement, so as to maintain the beam close to a stable point on the sensor.

Angle drift can be a result of the light source (1), the various mirror mounts, the supporting table, or many other sources. As such, a desirable location to place external sensor (A) is close to the point at which the light will be used, such as the light destination (1).

A single integrated mirror mount assembly (A) is typically used to stabilize the angle so as to maintain constant beam position at external sensor (A). However, some devices require stabilization of both beam angle and position. This can be achieved by using a second integrated mirror mount assembly (B), as shown in FIG. 12. Both of the integrated mirror mount assemblies (A) and (B) can be substantially similar to the integrated mirror mount assembly 500 described in FIG. 5. In one embodiment, mirror mount assembly (A) can be primarily used to stabilize the position of the beam on mirror mount assembly (B). Next, mirror mount assembly (B) is used to stabilize the angle of beam to reach light destination (1). To implement this technique, a beam tap (A) and external sensor (A) can be placed close to mirror mount assembly (B), with the signal from external sensor (A) fed back to mirror mount assembly (A) to hold the beam position stable on external sensor (A). Furthermore, a beam tap (B) and an external Sensor (B) can be placed close to light destination (1), with the signal from external sensor (B) fed back to mirror mount assembly (B) to hold the beam position stable on external sensor (B). This technique works well when the primary source of drift is the light source, and the platform and all other mounts are relatively stable.

In many optical systems, the source of optical drift can occur in many places, such as the mounting platform, the mounts, the mirror holder, the sensors, and the final instrument. As such, it may be more effective to sense the beam drift at the light destination, e.g., light destination (1) in FIG. 12, or another point that requires the stability. Sensors positioned near the light destination can include a beam tap and position sensor described-above. Beam angle can be sensed by placing a position sensor at the focus of a lens. These signals can be fed back to the integrated mirror mount assemblies through electronic connections, or through the external communication bus that interconnects mirror mount assemblies via a wire or wireless mechanism as described in conjunction with FIG. 6. This setup can require a sensor be placed on an external instrument, or embedded as part of the instrument. With a sufficiently intelligent alignment system, the output of a light beam manipulation system at the light destination can be used as an input signal to allow the integrated mirror mount assemblies, such as mirror mount assemblies (A) and (B) in FIG. 12 to optimize the respective position and angle for best performance. This technique requires the output of the light beam manipulation system at the light destination be coupled to the integrated mirror mount assemblies. This coupling can be enabled by a direct digital connection or an external communication bus via a wire or wireless communication mechanism. The coupling can also use an analog signal output from the system to be aligned as feedback into an analog voltage sensor in each of the integrated mirror mount assemblies.

Light Beam Path Alignment

In the cases when an optical system includes multiple mirror mounts, an alignment of an optical beam path is typically sequentially dependent on the alignments of prior mounts. Furthermore, more than one beam path can exist in such systems. In some embodiments, knowledge of the locations of these mirror mounts and their dependencies can be used by an integrated mirror mount assembly to align the beam path.

Typically, to automatically direct a beam to a mirror mount requires knowledge of location of that mirror mount. This position of the mirror mount can be manually set by a user directing a light source. For example, the user can set a reference beam directed to a defined point such as the center of a mirror on the mirror mount as described earlier. The mirror mount to be detected can include position sensors to detect a incident beam and feedback that information to the projecting mirror mount through one of the above-described techniques, including through digital signals, analog signals, or network communication. By feeding back the variation in position on the receiving mount for various angles of the projecting mount, a distance can be inferred, because a given angle movement at the projecting mount generally cause a larger position change at larger distances.

The mirror mounts in the neighborhood of an integrated mirror mount assembly can also be identified by using additional detection devices such as a camera or ultrasound signal. If a camera is attached to the frame of a mirror on the mirror mount assembly, then this camera will move with the mirror and therefore can be used separately to identify the locations of the neighboring objects. Image software exists to define edges and objects that may be identifiable visually. Hence, the mount location can be defined by the image processing and the approximate distance can be determined by the focus length adjustment required to receive a sharp image of the mirror mount. Low cost and compact cameras are readily available for use in personal devices such as cell phones. Additionally, two cameras placed on two sides of the mirror mount assembly, separated from each other laterally, can resolve the distance to another passive mirror mount by using parallax, or the difference in angle at the two cameras to resolve the same edge of the mirror mount to be located. A single camera can also be rotated as part of the normal mirror mount rotation. If the camera is placed off center of the rotation axis, a small position change in the camera can occur in addition to the angle change, allowing the position of the neighboring mount to be inferred by geometric optics.

Yet another technique for identifying nearby mirror mounts can include using an ultrasound transmitter and receiver fixed onto the mirror mount with a directional pattern to the beam. By scanning the mirror mount and using a sonar time-of-flight approach, the angle and distance to a neighboring mirror mount can be discovered.

In some embodiments, the locations of the external mirror mounts can be defined by the user using a graphical user interface.

With increased knowledge of the beam path, the user and system software can optimize the beam path alignment within the limits of the control available using the automated mirror mount assemblies.

In some embodiments, for user safety when working with a high power light source, the mirror can be tilted to direct the light beam downward to a beam block during horizontal movement. Alternatively, an optical power meter can be used as a beam block to both measure optical power during mirror movement, and to ensure that a final light destination can accept the power that will be projected. The system of the disclosed integrated mirror mount assemblies can also send a signal to turn off a high power light source during mirror movement for safety of operation. With the use of multiple light sources and high power light source, an optical shield can be provided to prevent damage at locations where the beam can be projected onto.

Mirror Mount for Wide Angle Movement with High Accuracy

A wide angle of movement of a mirror mount is of great value to the various applications described-above, because a wide angle allows for more light sources and light destinations, as well as closer positioning for more compact optical systems. An important improvement of the disclosed technology is the ability to send the same light beams in opposite directions, which in some applications can eliminate the need for an additional reflecting element or mirror. The ability to redirect a beam downwards by up to 90 degrees during repositioning can create a safe technique for transitioning between various beam directions. Such abilities are not available in the traditional mount using a spring loaded plate pushed by an actuator.

A galvanometer scanner may provide a potential solution for obtaining wide angle movement, and has an advantage of higher speed operation. However, one galvanometer typically scans in one direction, and a mirror placed on the galvanometer will typically be limited to less than 90 degrees of beam scan angle. Hence, to obtain a near 180 angle range, it requires that a light beam reflect off two galvanometers with rotations at right angle to each other. As such, a galvanometer may not be a preferred solution because of the larger size, higher cost, and limited travel range. Furthermore, a galvanometer will not retain a desired position without continuous power. In contrast, an integrated mirror mount assembly can maintain a rough position even when the supply of power is turned off or fails.

Figure 13:
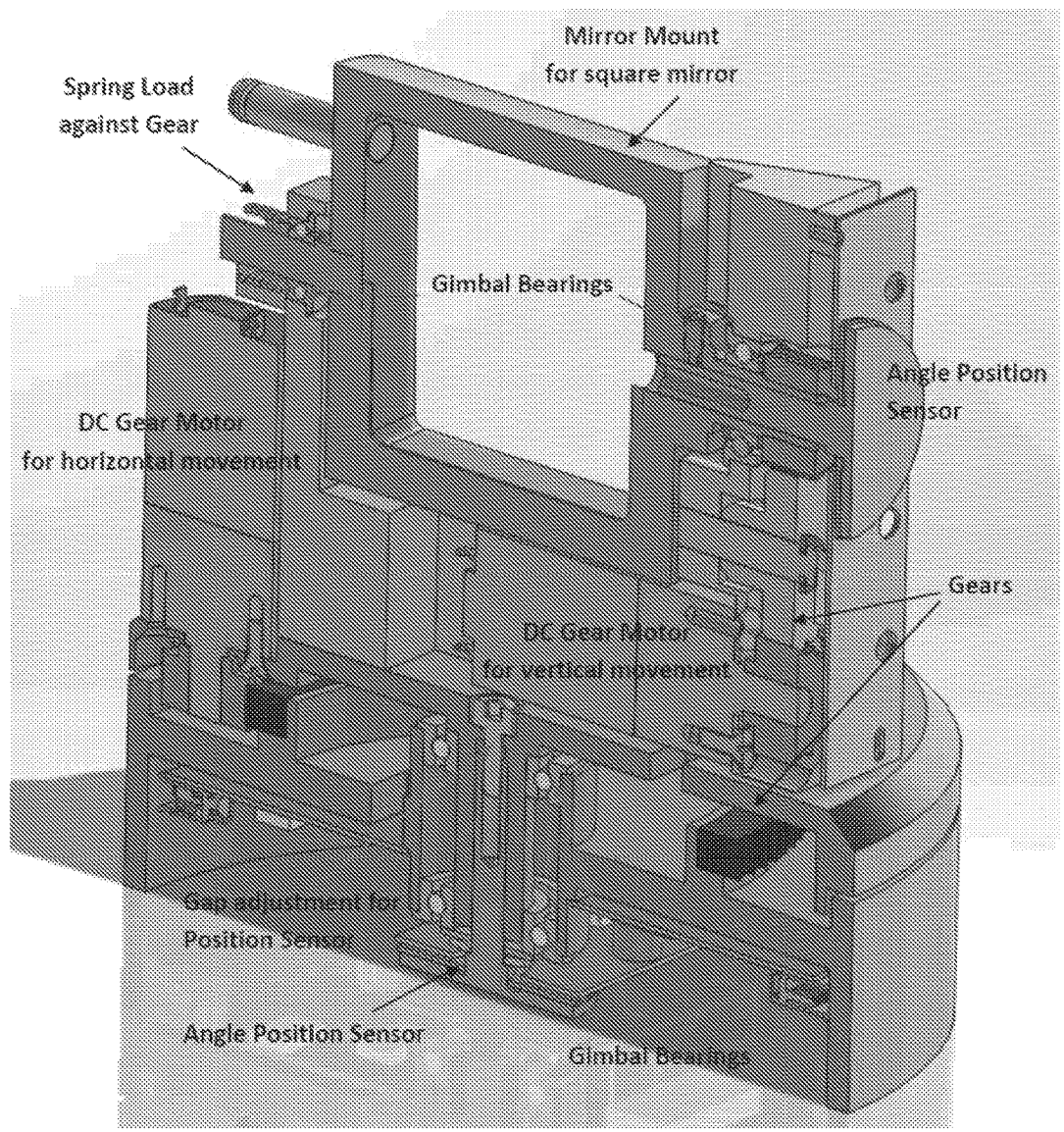
FIG. 13 shows the cross-sectional view of an exemplary integrated mirror mount assembly using a gimbal mount.

One solution to achieve wide angle capability is to use a gimbal mount directly driven by a gear motor. FIG. 13 shows the cross-sectional view of an exemplary integrated mirror mount assembly 1300 using a gimbal mount, which is capable of a full 360 degree rotation in vertical (altitude) and horizontal (azimuth) directions. Exemplary integrated mirror mount assembly 1300 provides a specific embodiment of mirror mount assembly 500. In this example, a preloaded gimbal mount using precision ball bearings, such as ABEC 7, can maintain a few microradian accuracy at low speeds required.

In some embodiments, a DC motor or stepper motor can be used to drive the gimbal mount in the integrated mirror mount assembly 1300 shown in FIG. 13. Typically, a stepper motor has limitations in resolution, typically around 200 steps per rotation. This precision is inadequate for a few microradian resolution which requires approximately one million steps per rotation. Gear reduction techniques can provide higher resolution, but with high gear reduction required, a DC motor can provide adequate torque with a smaller and lower power motor. The friction of a high gear reduction can help maintain mirror position with loss of power.

A high gear reduction can lead to an excessive backlash and wind-up which prevents movement of the mirror mount with high precision. This problem can be mitigated in two ways. First. the backlash can be reduced by use of a spring counter force against the gear rotation. A clock or torsion spring can be used to allow a full 360 degree rotation without excessive build up of force. Second, for microradian accuracy required in most applications, a high precision rotation angle sensor can be attached directly on the moving shaft, rather than the back end of a gear train as commonly used in DC motor drives. This setup is possible in a DC motor drive integrated with an especially high counts per rotation sensor in a low cost compact format.

A desirable motor drive needs to provide high speed for redirection between light sources and light destination in a short time, preferably less than a few seconds. A desirable motor drive also needs to provide slow speed motion for high accuracy positioning. For instance, if a position can be measured accurately within a millisecond, then the mirror mount needs to rotate at a rate of approximately once per 6283 seconds to allow the sensing within one microradian of movement. Consequently, the motor controller needs to drive over a wide range of speeds, e.g., greater than 1000 to 1, for high precision positioning.

It is generally difficult to drive a DC motor at low speeds due to varying torque requirements. The voltage $V_a$ applied to a motor is divided between back EMF which is directly proportional to the rotation speed S with a constant $k_r$, and the resistive voltage from the motor current I flowing through the winding resistance R, and can be expressed as:

$$V_a = k_r \times S + I \times R.$$

The motor current I is generally directly proportional to the torque T required to overcome friction in the gears and drive the mount against a spring. Thus $I = k_t \times T$. Combining the expressions for $V_a$ and I yields:

$$V_a = k_r \times S + k_t \times R \times T;$$

$$\text{or } S = (V_a - k_t \times R \times 1)/k_r.$$

When torque T is negligible, the expression of S indicates that a DC motor will rotate at a speed directly proportional to the applied voltage $V_a$, rotating in reverse for a negative voltage. However, when driving at slower speeds, the voltage is smaller and the torque can dominate the voltage requirement.

Once the applied voltage drops below what is needed for providing the torque, the motor stops or stalls. Furthermore, if the torque has fluctuations due to gear misalignment, dirt, or other factors, then the back EMF needed for very low speeds may be dominated by fluctuations in torque, so that the motor can stall when the torque rises at slow speeds. A mitigation of this issue is to measure the motor current and to apply an incremental voltage to compensate for the torque to cancel the torque term. This way, for a desired rotation speed Sa, $$V_a = k_r \times S_a + I \times R,$$

which gives rise to the desired result that $S_a = S$. More importantly, as the torque and current fluctuate, so does the extra voltage of I×R, allowing a smaller level of back EMF. This compensation technique requires an accurate measurement of current as well as the winding resistance R for a given motor to achieve a precise compensation. In practice, this technique may improve the ability to run at slower speed which is well under 1% of full speed. Further slow speed motion control can come from feedback on the angle position sensor to adjust the speed further.

Figure 14:
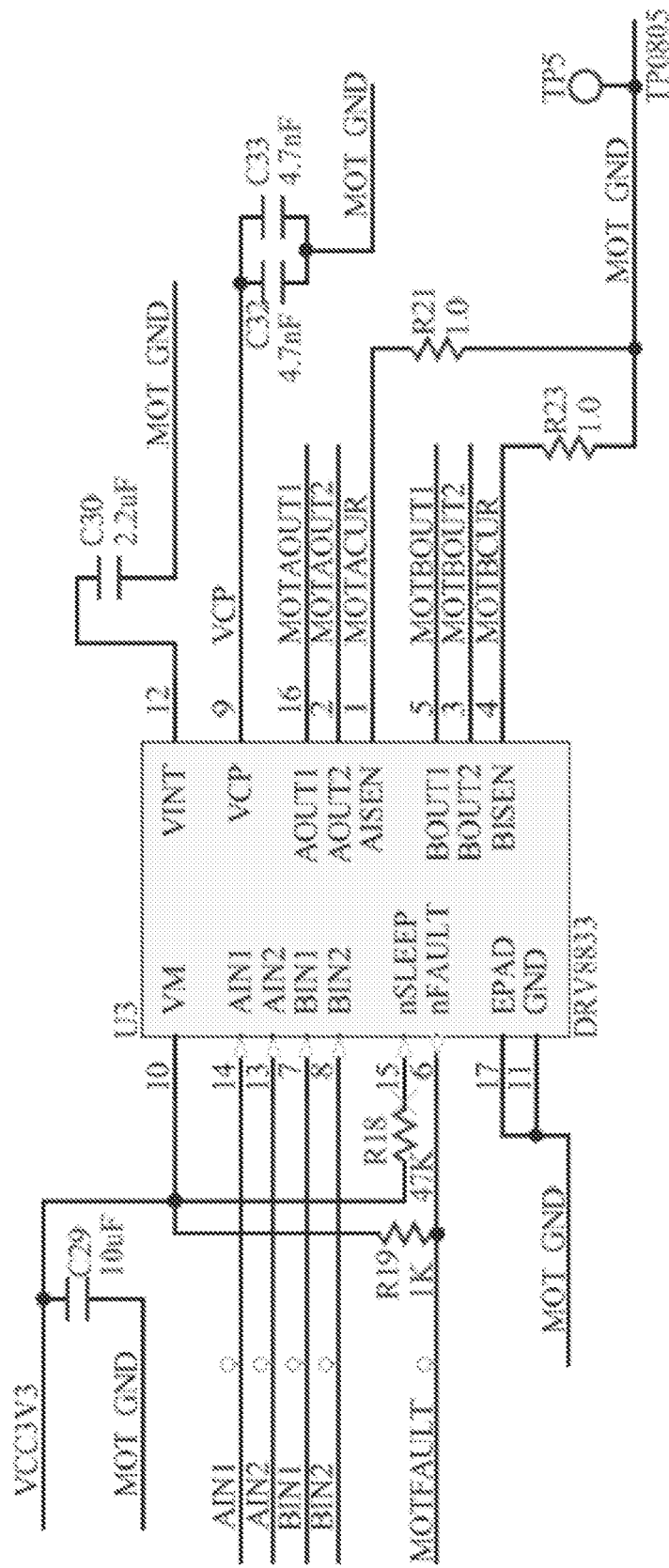
FIG. 14 shows a FPGA logic for implementing a pulse width modulation using an H-Bridge Driver Chip.

The DC motor in the disclosed integrated mirror mount assembly can be driven by a pulse width modulation circuit, or by an applied linear voltage from an operational amplifier. A pulse width modulation circuit has the advantage of being able to use an H-bridge driver to eliminate the need for a negative voltage supply. The pulse width modulation can operate in the range of 10 to 50 kHz to reduce acoustic noise and harsh vibrations. For example, for a 20 kHz modulation, the repetition rate is 50 µs. For slow speed motion, the pulse may need to be few µs and controlled to a small fraction of that pulse width, requiring a resolution of a few 10s of nanoseconds. This pulse width adjustment and motor control can be generated by a microprocessor program or FPGA logic as shown in FIG. 14, which shows a FPGA logic for implementing a pulse width modulation using an H-Bridge Driver Chip. The H-Bridge driver in this example is a Texas Instruments part number DRV8833 driving the DC motor at 3.3 V. By applying various logic levels to AIN1 and AIN2, the motor, across pins MOTAOUT1 and MOTAOUT2 can be driven with positive or negative voltage to move forward or backwards. The pulse width modulation is also applied to the pins AIN1 and AIN2. The part DRV8833 can also drive a second motor B with the similar inputs and outputs.

Figure 15:
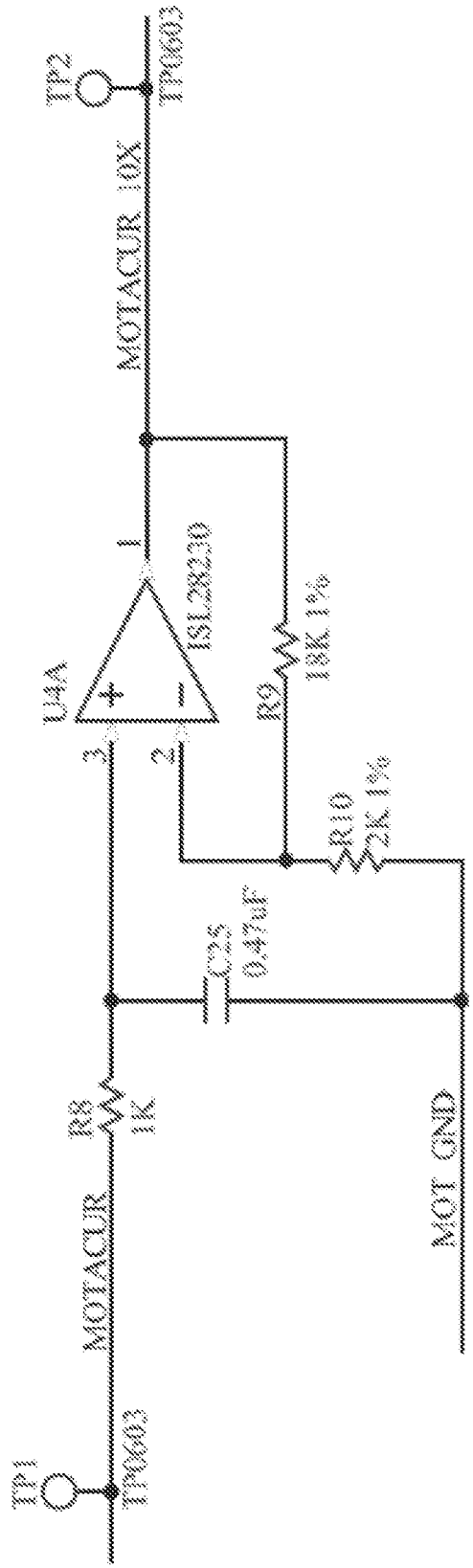
FIG. 15 shows an example of a motor current measurement circuit.

FIG. 15 shows an example of a motor current measurement circuit 1500. This current sensing circuit takes the voltage MOTACUR across a 1 Ohm sense resistor as shown in FIG. 14, and amplifies by 10 to better fit the range of a 12-bit Analog-to-Digital converter with 1 volt range. The OpAmp input uses a resistor and a capacitor to smooth and average the pulse width modulated input to improve measurement accuracy, in this example with an RC time constant of 1 kOhm×0.47 µF=0.47 milliseconds. The measurement can be further averaged with a logic after the conversion to a digital form. The OpAmp U4 is Intersil part number ISL28230, chosen for low input voltage offset to achieve high accuracy on the current sensing.

The current measurement is used to increase the pulse width modulation to be proportional to the motor current as previously described to allow accurate slow speed control. This control can be provided with a microprocessor logic, or within a FPGA logic.

For high accuracy positioning and stabilization, small movements of few 10s of microradians may be required. The wind-up motion of the gears and spring pushing against variable force from a small variation in pulse width can aid in providing small deviations desirable.

High Precision Angular and Linear Position Sensing

The disclosed integrated mirror mount assembly also finds applications which require a high resolution angular rotation sensor with a few microradian resolution. This sensor needs to be compact and able to apply directly to the rotation shaft.

One of the techniques for angle sensing measures the capacitance change in a capacitor formed by two metal patterns or electrodes as one metal pattern rotates above or with respect to another metal pattern. In one embodiment, a patterned metal ground plate is placed on the rotating shaft, and a mating metal pattern is placed on a stationary sensing board, separated by a small gap to create a capacitor between the two patterns. This approach has limited precision due to drift with time and temperature in the galvanometer applications. However, the galvanometer application also needs much higher speed measurement, e.g., a below one millisecond response time. For beam redirection and stabilization, a response time of 10 ms are generally acceptable and comparable with DC motor control time constants. This allows an improvement on the standard solution.

In various implementations, the precision sensing technique using capacitance implements a symmetric pattern about the center that can compensate for any variation in air gap between the plates that create the capacitor. An alternating pattern uses two patterns complementary to each other, so that during rotation, as one pattern is increasing in capacitance, the other pattern at the same radius is decreasing in capacitance, with the sum remaining constant for a constant gap distance. Thus, a measurement of relative movement is achieved by normalizing the difference in capacitance over the sum for the alternating patterns. Furthermore, an alternating pattern can also help compensate for relative tilt of the axis.

The capacitance for precision sensing can be affected by drift over time due to changes in gap and temperature which also affects the sensing circuits. A higher frequency angular pattern can have similar overall capacitance for the same area, but a higher rate of change, which gives rise to a smaller deviation in angle and higher angular precision for the same percentage capacitance precision. For example, a ring with 100 alternating patterns around the circumference can provide a much higher resolution and stability over a ring with just 4 alternating patterns. This higher frequency pattern is not typically used in galvanometer because such a pattern causes difficulty in deriving absolute angle position and requires higher speed capacitance sensing, which is already near the limit of circuit capability for the required speed.

Advances in capacitance-to-digital conversion technology has occurred to meet market demand for touch sensitive controls. These new low cost integrated circuits, such as Analog Devices AD7148 capacitance-to-digital converter, provide 16-bit high resolution and low cost sensing of capacitance with femto-Farad resolution for multiple channels. The speed of multiple conversions can be as fast as a few milliseconds, which meets the needs for high speed capacitance sensing applications. Furthermore, this circuit component provides a shielding function which can create greater isolation of the capacitance measurement from external influences by placing a shielding metal layer on a parallel printed circuit board plane opposite to that of the rotating ground pattern.

Figure 16:
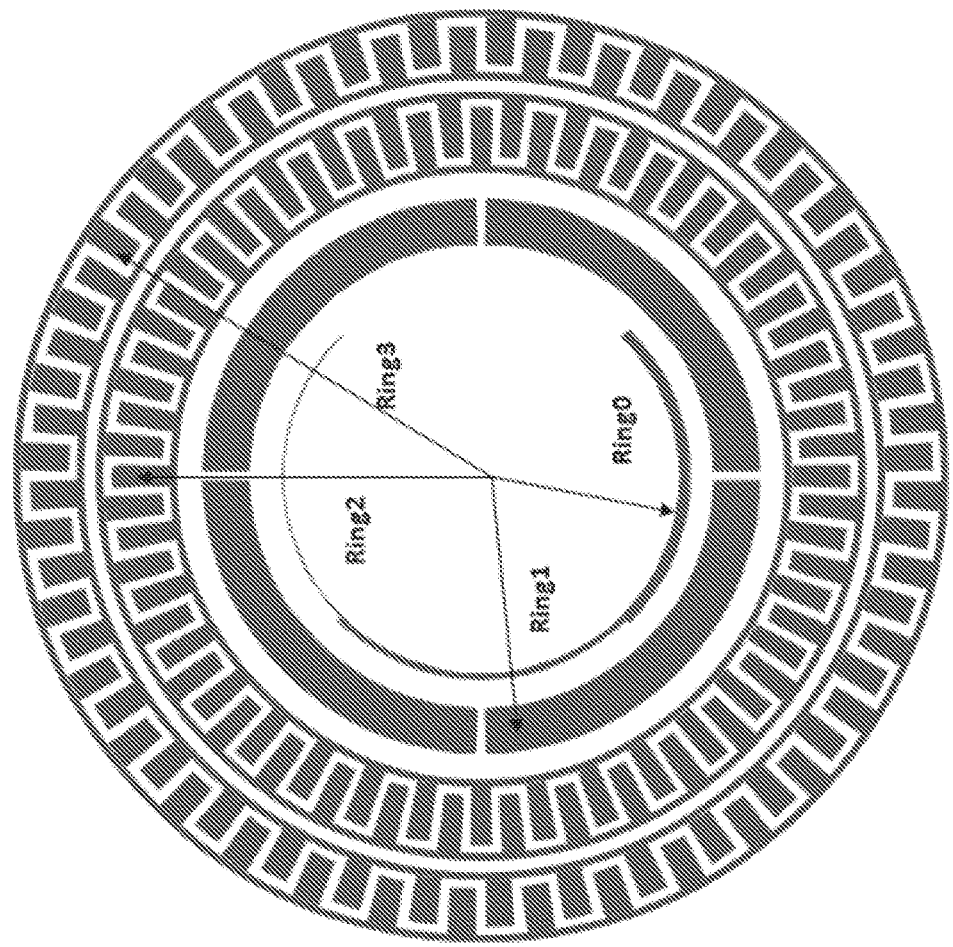
FIG. 16 shows an exemplary rotation angular sensing pattern of a sensing capacitor.
Figure 17:
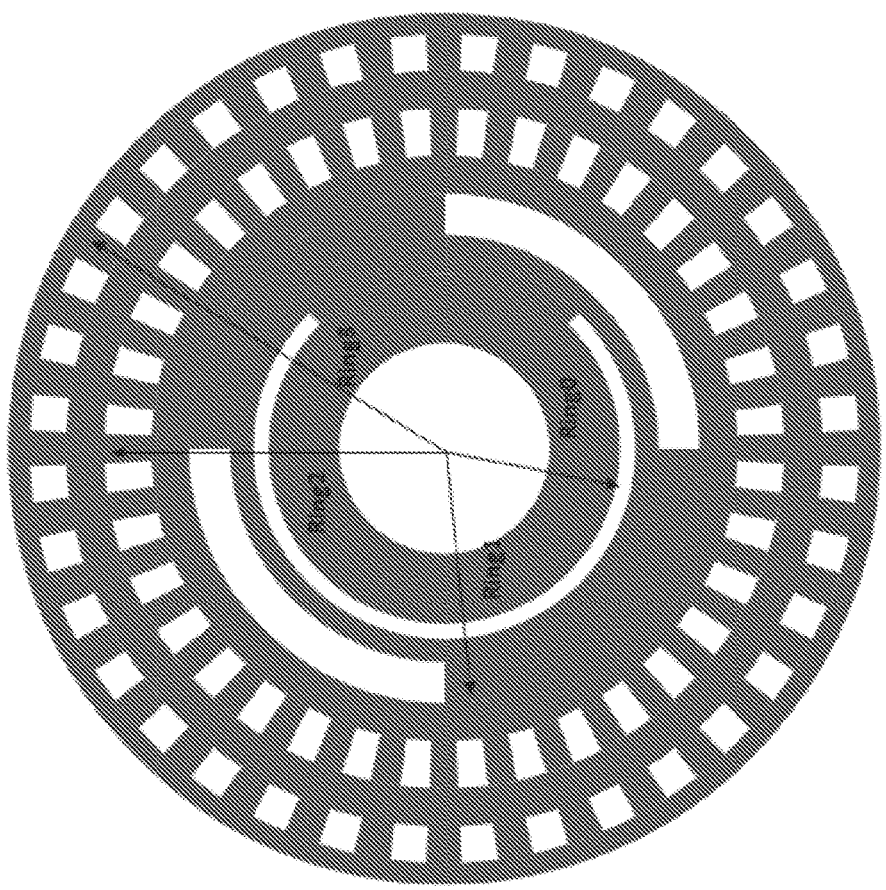
FIG. 17 shows an exemplary ground pattern on a rotating shaft.

The high resolution and multiple channels of the AD7148 integrated circuit can be used for capacitive sensing of high frequency angular patterns such as those shown in FIG. 16 and FIG. 17. More specifically, FIG. 16 shows an exemplary rotation angular sensing pattern 1600 and FIG. 17 shows an exemplary ground pattern 1700 on a rotating shaft, the two patterns of FIGS. 16 and 17 form the patterns of the two capacitance plates separated by a small gap. These mating plates each contains four rings of capacitor sensing structures, Ring 0 to Ring 3. Ring 0 is the only ring of the four rings that is not compensated by a complementary pattern and is only used to discriminate between the repeating quadrants of Ring 1 for absolute position determination on 360 degree rotations. Ring 1 has four quadrants with the opposite quadrants shorted, to make two capacitance outputs that are complementary. This configuration of Ring 1 means that one output increases in capacitance as the other output decreases in capacitance as the ground pattern of FIG. 17 rotates in close proximity. Ring 2 and Ring 3 cumulatively have 144 lines or patterns per revolution. The patterns alternate so as to provide a complementary signal for allowing independence of gap and tilt between the plates by normalizing to the sum. Ring 3 is similar to Ring 2, but offset in phase so that at positions where Ring 2 has a slowly varying capacitance versus angle, Ring 3 has a highly varying signal, and vice versa. This approach allows the control system to choose a highly varying pattern with higher resolution in the measurement of angular position. If the gap between lines were small, then the capacitance versus angle would be a saw tooth function. However, a gap is necessary for fabrication tolerance, and the function is more rounded at the maximum and minimum points. Because the capacitance function is not a standard saw tooth or sine wave versus rotation angle, the angle versus capacitance has to be derived from a formula or look up table.

In the capacitance example of FIG. 16 and FIG. 17, using a 0.05 mm gap between the patterned metal plates and sensor diameter of about 16 mm, the Ring 1 to Ring 3 have a total capacitance of 1.5 to 2 pico-Farads, allowing a 5 microradian resolution when sensed by the AD7148 integrated circuit. The sensor gap can be adjusted during manufacture as shown in FIG. 13.

The above capacitance structure can provide 7 capacitance outputs (two for each ring expect for Ring 0 which does not have a complementary pattern). The conversion of these capacitance measurements to an angle output requires a microprocessor to perform the normalization relative to the sum of each ring's complementary capacitance, apply a look up table for capacitance versus angle, and sort through the outputs from these rings to create an absolute position with the highest resolution.

While the above-discussion describes a low-cost angular rotation sensing mechanism, the same sensing technique can also be applied to a linear position sensing within a motorized mirror mount assembly integrated with a linear motion stage. For example, in a linear position sensing setup, the capacitive patterns shown in FIGS. 16 and 17 can be placed on a straight line pattern onto two capacitive plates rather than on an arc path pattern. Next, a change in capacitance due to a linear displacement between the two capacitive plates can be used to determine a change in a linear position of the mirror mount assembly.

Integrated Electronic System for Mirror Mounts

The disclosed technology provides a system that integrates actuators, drivers, position sensors, electronics, logic, computing, software, and advanced communication components into a compact package. The discussion below describes some exemplary implementations of the disclosed technology.

Recent advances in electronics have led to sophisticated system on chips (SOC). An example of the SOC is the Xilinx Zynq SOC which integrates a dual core ARM processor with an FPGA logic matrix. This system also incorporates memory drivers, USB interfaces, flash memory controllers, Analog-to-Digital converters, and other functions into a single compact low-cost integrated circuit.

The dual core processor allows one processor to handle real time and mount related control tasks using a Real Time Operating System (RTOS) or alternatively a simple program without an operating system (referred to as "bare metal").

The other processor core can function with a sophisticated operating system such as Linux, to allow high level networking and communication including standard USB drivers, useful for camera interfaces, as well as file system handling. Advanced IP protocols such as AJAX can be used to provide a browser interface to computers, tablets and cell phones for remote control and monitoring using high resolution screens already in user possession.

The FPGA fabric allows for external digital interfaces to sensors and controls. The processor and FPGA fabric can sense an attached external accessory through an ID chip, then restructure the logic matrix as appropriate to interface to that device. Examples of such external accessories within the disclosed system can include:

Power meter interface using A/D conversion and SPI or I2C serial protocols;
Position Sensitive Detector with automatic gain using A/D conversion and SPI or I2C protocols;
User control of horizontal and vertical position using knob encoder and button input;
WiFi interface through SPI or I2C protocol;
Bluetooth interface through SPI or I2C protocol;
ZigBee interface through SPI or I2C protocol
Power and control of reference laser source including modulation, sense back reflection for absolute angle adjustment;
Digital interface to external devices, such as for turning off high power lasers during motion;
Receiving input from external instruments on alignment needs;
Communicating to other Mirror Mount Assemblies;
Provide analog output via external Digital-to-Analog converters.

Furthermore, the mirror mount assembly system can include a removable SD card interface to allow saving positions and user names of external elements, storing data collected, and upgrading to software and FPGA logic as new accessories become available. A Real Time Clock can provide date and time stamps on data collected.

The mirror mount assembly system can include a Zynq Analog-to-Digital converter that can read external analog signals, useful for alignment feedback via compact SMA connectors.

Figure 18:
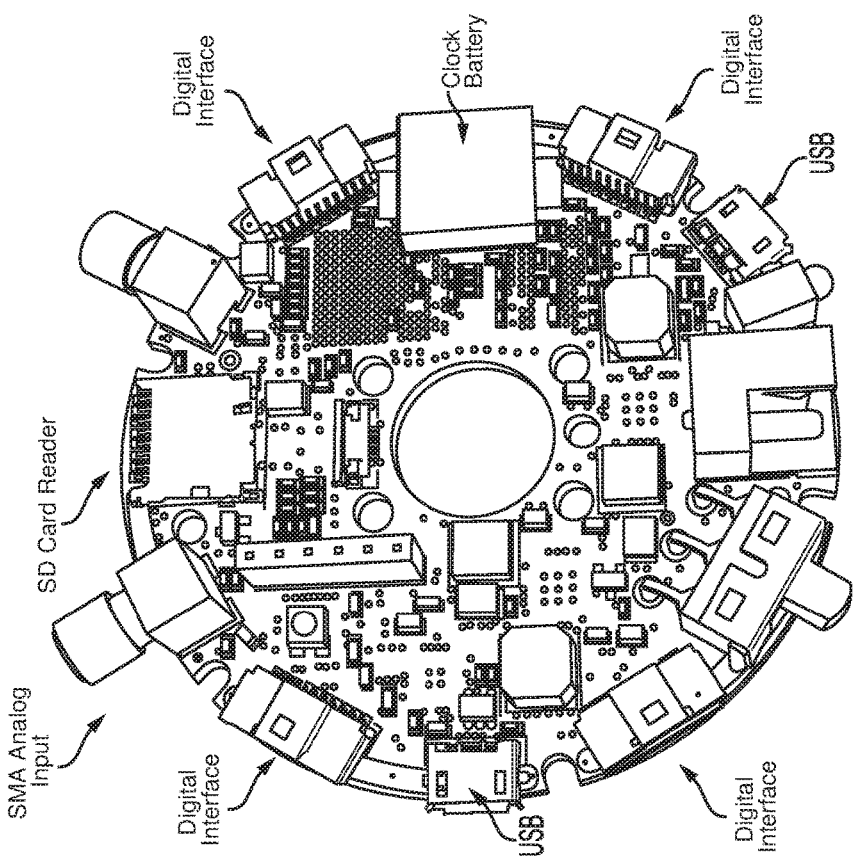
FIG. 18 shows the bottom connector side of the exemplary integrated mirror mount assembly system.

An example of how these sophisticated electronic functions can fit in a compact mirror mount assembly system with a 67 mm diameter is shown in FIG. 18 and FIG. 19. More specifically, FIG. 18 shows the bottom connector side of the exemplary integrated mirror mount assembly system, while FIG. 19 shows the top component side of the exemplary integrated mirror mount assembly system. The combined system depicted by FIG. 18 and FIG. 19 provides a specific embodiment of the control, driver, and sensor electronics of mirror mount assembly 500, more fully depicted in the cross-section of FIG. 13.

While this patent document contains many specifics, these should not be construed as limitations on the scope of any invention or of what may be claimed, but rather as descriptions of features that may be specific to particular embodiments of particular inventions. Certain features that are described in this patent document and attached appendix in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document and attached appendix should not be understood as requiring such separation in all embodiments.

Only a few implementations and examples are described and other implementations, enhancements and variations can be made based on what is described and illustrated in this patent document.

What is claimed is:

1. A mirror mount assembly for manipulation of light, comprising:
a mirror;
a mechanical mount supporting the mirror;
an actuator mechanically coupled to the mechanical mount to provide a movement of the mechanical mount;
a driver electrically coupled to the actuator to drive the actuator; and
a control module electrically coupled to the driver to provide drive signals to the driver, wherein the control module includes a processor for generating the drive signals and for autonomously implementing user defined functions on the mirror mount assembly; and
one or more communication interfaces coupled to the control module to receive one or more input signals from a first set of external devices and to transmit one or more output signals to a second set of external devices,
wherein the mirror mount assembly is a master mirror mount assembly, and wherein the control module in the master mirror mount assembly is configured to control one or more slave mirror mount assemblies through the one or more communication interfaces.

2. The mirror mount assembly of claim 1, wherein the one or more communication interfaces include one or more digital interfaces to couple to power sensors, position sensitive detectors, knobs for position control, or Blue Tooth or WiFi interfaces.

3. The mirror mount assembly of claim 2, wherein the processor includes a field-programmable gate array (FPGA).

4. The mirror mount assembly of claim 3, wherein the FPGA is reconfigurable to control the one or more digital interfaces.

5. The mirror mount assembly of claim 1, wherein the one or more communication interfaces include one or more USB interfaces to couple to cameras, USB controlled instruments such as spectrometers, or WiFi adaptors.

6. The mirror mount assembly of claim 5, wherein the USB interfaces are configured to control one or more USB devices plugged into USB ports by loading proper software drivers for the one or more USB devices.

7. The mirror mount assembly of claim 1, wherein the processor includes a single core CPU or a multi-core CPU.

8. The mirror mount assembly of claim 1, wherein the mirror mount assembly is configured to communicate with an external user interface, an Internet cloud, or a laboratory instrument through the one or more communication interfaces.

9. The mirror mount assembly of claim 1, wherein the movement of the mechanical mount includes an angular movement or a linear movement.

10. The mirror mount assembly of claim 1, wherein the actuator is a stepper motor, DC motor, or a piezoelectric actuator.

11. The mirror mount assembly of claim 1, further including an integrated sensor coupled to the mechanical mount to detect an angular or linear position change of the mechanical mount, wherein the integrated sensor is electrically coupled to the control module to provide feedback signals to be processed by the control module for adjusting angle and position of the mirror.

12. The mirror mount assembly of claim 11, wherein the integrated sensor is attached directly to the mechanical mount so as to be independent of drive mechanics of the driver and any inaccuracy of operation of the actuator.

13. The mirror mount assembly of claim 11, wherein the mirror mount assembly uses a guide laser directed onto the mirror as a defined position and angle for providing a reference alignment angle for measuring other positions located relative to the guide laser by using the integrated sensor.

14. A mirror mount assembly for manipulation of light, comprising:
    a mirror;
    a mechanical mount supporting the mirror;
    an actuator mechanically coupled to the mechanical mount to provide a movement of the mechanical mount;
    a driver electrically coupled to the actuator to drive the actuator;
    a control module electrically coupled to the driver to provide drive signals to the driver, wherein the control module includes a processor for generating the drive signals and for autonomously implementing user defined functions on the mirror mount assembly; and
    an integrated sensor coupled to the mechanical mount to detect an angular or linear position change of the mechanical mount, wherein the integrated sensor is electrically coupled to the control module to provide feedback signals to be processed by the control module for adjusting angle and position of the mirror,
wherein the integrated sensor is a patterned capacitive sensor that includes:
    alternating periodic pattern of metal lines or metal rings formed on a moving board; and
    a mating pattern formed on a stationary board that has a gap from the moving board, wherein the alternating periodic pattern and the mating pattern form a capacitance,
    wherein the capacitive sensor is configured to measure a change in the capacitance when the moving board rotates or displaces with respect to the stationary board; and
    wherein the change in the capacitance is used to determine an angular or linear position change between the moving board and the stationary board.

15. A mirror mount assembly for manipulation of light, comprising:
    a mirror;
    a mechanical mount supporting the mirror;
    an actuator mechanically coupled to the mechanical mount to provide a movement of the mechanical mount;
    a driver electrically coupled to the actuator to drive the actuator; and
    a control module electrically coupled to the driver to provide drive signals to the driver, wherein the control module includes a processor for generating the drive signals and for autonomously implementing user defined functions on the mirror mount assembly;
    an integrated sensor coupled to the mechanical mount to detect an angular or linear position change of the mechanical mount, wherein the integrated sensor is electrically coupled to the control module to provide feedback signals to be processed by the control module for adjusting angle and position of the mirror; and
    a stabilization mechanism which is configured to use feedback from internal and external sensors to adjust a position of the mirror mount assembly to compensate for environmental effects.

16. The mirror mount assembly of claim 15, wherein the stabilization mechanism is configured to use the feedback from the internal temperature sensors to stabilize a temperature of the mirror mount assembly.

17. The mirror mount assembly of claim 16, where the temperature of the mirror mount assembly is maintained by an internal heater controlled by the processor.

18. The mirror mount assembly of claim 16, where the temperature of the mirror mount assembly is maintained by the processor operating at higher and lower power efficiency modes, such as by adding extra computing cycles, or reading and writing data to a memory, to increase thermal dissipation as needed for stabilization of temperature.

19. A mirror mount assembly for manipulation of light, comprising:
    a mirror;
    a mechanical mount supporting the mirror;
    an actuator mechanically coupled to the mechanical mount to provide a movement of the mechanical mount;
    a driver electrically coupled to the actuator to drive the actuator; and
    a control module electrically coupled to the driver to provide drive signals to the driver, wherein the control module includes a processor for generating the drive signals and for autonomously implementing user defined functions on the mirror mount assembly; and
    a sensor for sensing other elements in the environment, wherein information from the sensor is used to aid in defining locations to direct the beam.

20. The mirror mount assembly of claim 19, wherein the mirror mount assembly uses one or two camera images, along with focus and parallax information, on a moving platform to determine location of other elements in the environment.

21. The mirror mount assembly of claim 19, wherein the mirror mount assembly uses an ultrasound beam on the moving platform to determine location of other elements in the environment with sonar sensing.

* * * * *